United States Patent
Huang et al.

(10) Patent No.: US 10,090,449 B2
(45) Date of Patent: *Oct. 2, 2018

(54) LIGHT EMITTING DEVICE

(71) Applicant: PlayNitride Inc., Tainan (TW)

(72) Inventors: Shao-Hua Huang, Tainan (TW); Yun-Li Li, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/712,145

(22) Filed: Sep. 22, 2017

(65) Prior Publication Data

US 2018/0013046 A1    Jan. 11, 2018

Related U.S. Application Data

(63) Continuation-in-part of application No. 14/922,214, filed on Oct. 26, 2015, now Pat. No. 9,793,438.

(60) Provisional application No. 62/081,503, filed on Nov. 18, 2014, provisional application No. 62/092,265, filed on Dec. 16, 2014.

(30) Foreign Application Priority Data

May 6, 2015    (TW) .............................. 104114440 A

(51) Int. Cl.
| | |
|---|---|
| *H01L 33/00* | (2010.01) |
| *H01L 33/62* | (2010.01) |
| *H01L 33/50* | (2010.01) |
| *H01L 33/60* | (2010.01) |
| *H01L 33/38* | (2010.01) |

(Continued)

(52) U.S. Cl.
CPC .............. *H01L 33/62* (2013.01); *H01L 33/38* (2013.01); *H01L 33/382* (2013.01); *H01L 33/505* (2013.01); *H01L 33/60* (2013.01); *H01L 33/44* (2013.01); *H01L 33/486* (2013.01)

(58) Field of Classification Search
None
See application file for complete search history.

(56) References Cited

U.S. PATENT DOCUMENTS 9,793,438 B2 *  10/2017  Huang ................. H01L 33/382
2012/0074441 A1    3/2012  Seo et al.
(Continued)

FOREIGN PATENT DOCUMENTS

TW    201228034    7/2012

*Primary Examiner* — Reema Patel
(74) *Attorney, Agent, or Firm* — JCIPRNET

(57) ABSTRACT

A light emitting device of the invention includes a substrate, an electrode connection layer, and at least one epitaxial structure. The substrate has an upper surface and a plurality of electrode pads disposed on the upper surface. The electrode connection layer is disposed on the upper surface of the substrate and electrically connected to the plurality of electrode pads. The electrode connection layer has at least one first electrode, at least one second electrode and at least one connection layer disposed between the substrate and the at least one first electrode and disposed between the substrate and the at least one second electrode. The at least one connection layer has at least one buffer region exposed on the upper surface of the substrate and being an empty gap. The at least one epitaxial structure is disposed on and electrically connected to the electrode connection layer.

17 Claims, 22 Drawing Sheets

(51) Int. Cl.
  *H01L 33/44* (2010.01)
  *H01L 33/48* (2010.01)

(56) References Cited

U.S. PATENT DOCUMENTS

2014/0131657 A1* 5/2014 Kim .................. H01L 33/06
                                                 257/13
2015/0243853 A1    8/2015 Cha et al.

* cited by examiner

LIGHT EMITTING DEVICE

CROSS-REFERENCE TO RELATED APPLICATION

This application is a continuation-in-part application of and claims the priority benefit of U.S. application Ser. No. 14/922,214, filed on Oct. 26, 2015, now allowed. The prior U.S. application Ser. No. 14/922,214 claims the priority benefits of U.S. provisional application Ser. No. 62/081,503, filed on Nov. 18, 2014, U.S. provisional application Ser. No. 62/092,265, filed on Dec. 16, 2014, and Taiwan application serial no. 104114440, filed on May 6, 2015. The entirety of each of the above-mentioned patent applications is hereby incorporated by reference herein and made a part of this specification.

BACKGROUND OF THE INVENTION

Field of the Invention

The invention relates to a semiconductor device, and particularly relates to a light emitting device.

Description of Related Art

Generally, a light emitting chip is composed of an epitaxial structure, N-type electrodes and P-type electrodes, where the N-type electrodes and the P-type electrodes respectively contact an N-type semiconductor layer and a P-type semiconductor layer. In order to expand the application of the light emitting chip, the manufactured light emitting chip is generally disposed on a carrier, and a molding compound is used to package the light emitting chip to form a light emitting device. Generally, the metal bonding is generated by rising the temperature, so as to bond the light emitting chip to the carrier. Because of the mismatch of the thermal expansion coefficient of the light emitting chip and the carrier, the thermal stress generated and the warpage phenomenon gradually become more and more serious, so as to decrease the reliability of the light emitting device.

SUMMARY OF THE INVENTION

The invention provides a light emitting device which has a better reliability.

A light emitting device of the invention includes a substrate, an electrode connection layer, and at least one epitaxial structure. The substrate has an upper surface and a plurality of electrode pads disposed on the upper surface. The electrode connection layer is disposed on the upper surface of the substrate and electrically connected to the plurality of electrode pads. The electrode connection layer has at least one first electrode, at least one second electrode and at least one connection layer disposed between the substrate and the at least one first electrode and disposed between the substrate and the at least one second electrode. The at least one connection layer has at least one buffer region exposed on the upper surface of the substrate, and the at least one buffer region is an empty gap. The at least one epitaxial structure is disposed on the electrode connection layer and electrically connected to the electrode connection layer.

According to an embodiment of the invention, a center width of the at least one buffer region is smaller than an edge width of the at least one buffer region.

According to an embodiment of the invention, the plurality of electrode pads have a distance therebetween, and the width of the at least one buffer region is 0.1 to 1.5 times the distance between the plurality of electrode pads.

According to an embodiment of the invention, the light emitting device further includes an insulating layer disposed on the electrode connection layer and insulating from the at least one first electrode and the at least one second electrode, and the at least one buffer region locates among the insulating layer, the at least one connection layer, and the substrate.

According to an embodiment of the invention, a Young's Modulus of the insulating layer is less than a Young's Modulus of the electrode connection layer.

According to an embodiment of the invention, the at least one epitaxial structure further comprises a first type semiconductor layer, a light emitting layer, and a second type semiconductor layer. The first type semiconductor layer is disposed on the insulating layer, and the at least one first electrode penetrates through the insulating layer and is electrically connected to the first type semiconductor layer. The light emitting layer is disposed on the first type semiconductor layer. The second type semiconductor layer is disposed on the light emitting layer. The at least one second electrode penetrates through the insulating layer, the first type semiconductor layer and the light emitting layer so as to electrically connect to the second type semiconductor layer.

According to an embodiment of the invention, the light emitting device further includes an ohmic contact layer disposed between the first type semiconductor layer and the insulating layer.

According to an embodiment of the invention, a projection area of the ohmic contact layer on the substrate is less than a projection area of the first type semiconductor layer.

According to an embodiment of the invention, the light emitting device further includes an insulation protection layer covering an edge of the first type semiconductor layer, an edge of the light emitting layer and an edge of the second type semiconductor layer, wherein an edge of the insulation protection layer is aligned with an edge of the insulating layer.

According to an embodiment of the invention, the light emitting device further includes a wavelength converting layer disposed on the at least one epitaxial structure, and an edge of the wavelength converting layer is aligned with an edge of the substrate.

According to an embodiment of the invention, the at least one epitaxial structure has a rough surface, and the rough surface and the wavelength converting layer have nano-scale voids therebetween.

According to an embodiment of the invention, the at least one epitaxial structure is a plurality of epitaxial structures, and each of the plurality of epitaxial structures corresponds to at least one of the at least one first electrode, at least one of the at least one second electrode and one of the at least one connection layer.

According to an embodiment of the invention, the plurality of epitaxial structures comprise at least one red light epitaxial structure, at least one blue light epitaxial structure and at least one green light epitaxial structure.

According to an embodiment of the invention, the plurality of epitaxial structures comprise at least one a first epitaxial structure and at least one a second epitaxial structure. The at least one first epitaxial structure and the at least one second epitaxial structure have different light colors. The at least one first epitaxial structure has a first height, the at least one second epitaxial structure has a second height, and the first height is less than the second height.

According to an embodiment of the invention, the at least one first epitaxial structure corresponds to the at least one buffer region having a first central width. The at least one second epitaxial structure corresponds to the at least one buffer region having a second central width. The first central width is less than the second central width.

According to an embodiment of the invention, a width of the at least one epitaxial structure is between 1 micrometer and 100 micrometers.

According to an embodiment of the invention, the substrate is a multi-layer substrate.

Based on the above, since the electrode connection layer of the invention has the buffer region which can serve as a buffer between the electrode connection layer and other layers having different thermal expansion coefficient from the electrode connection layer under different temperature variation operation, so as to increase the reliability of the light emitting device of the invention.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
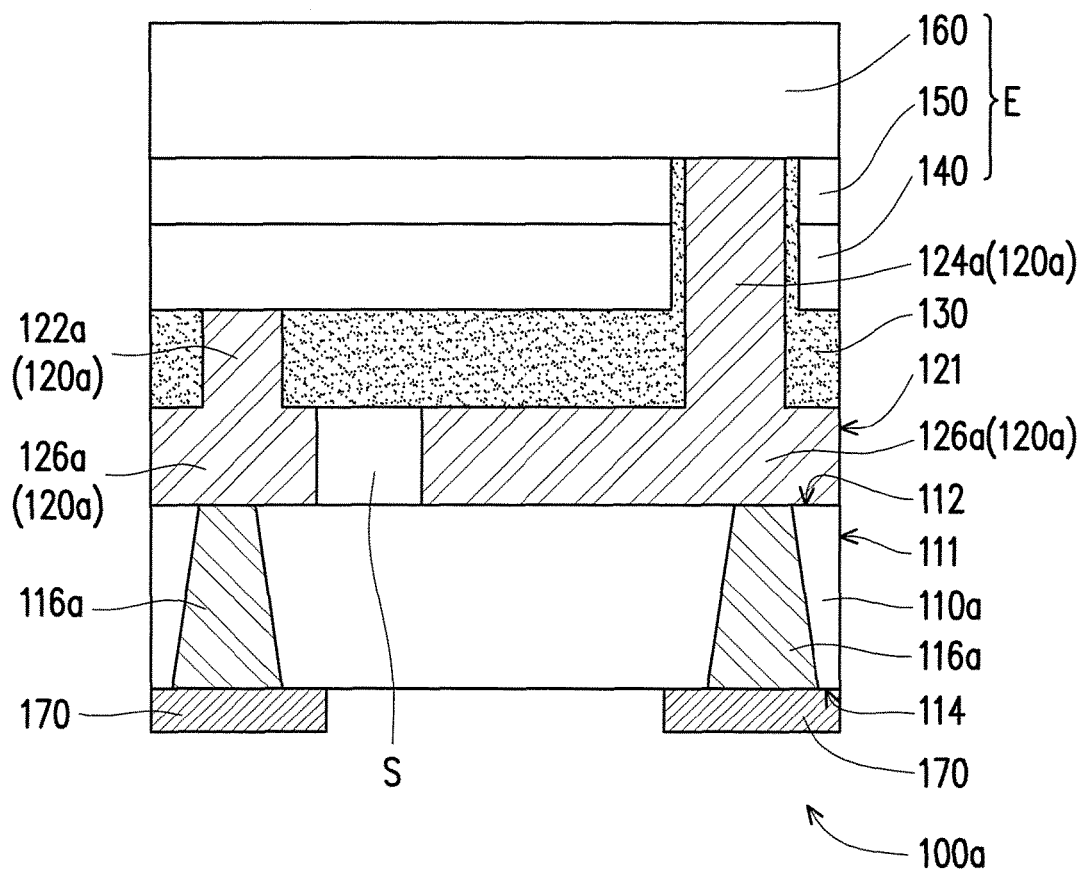
FIG. 1A is a schematic cross-sectional view of a light emitting device according to one embodiment of the invention.

FIG. 1A is a schematic cross-sectional view of a light emitting device according to an embodiment of the invention. Referring to FIG. 1A, a light emitting device 100a in the present embodiment includes a substrate 110a, an electrode connection layer 120a, an insulating layer 130, an epitaxial structure E, and a plurality of pads 170. More specifically, the substrate 110a has an upper surface 112, a lower surface 114 opposite to the upper surface 112, and a plurality of conductive through holes 116a which penetrate through the substrate 110a and connect to the upper surface 112 and the lower surface 114. The electrode connection layer 120a is disposed on the upper surface 112 of the substrate 110a and electrically connected to the conductive through holes 116a. In addition, the electrode connection layer 120a has at least one first electrode 122a, at least one second electrode 124a, and a connection layer 126a which is disposed between the substrate 110a and the first electrode 122a and disposed between the substrate 110a and the second electrode 124a. Furthermore, the connection layer 126a has at least one buffer region S exposed on the upper surface 112 of the substrate 110a. The epitaxial structure E is disposed on the electrode connection layer 120a and electrically connected to the electrode connection layer 120a. The pads 170 are disposed on the lower surface 114 of the substrate 110a and connecting with the conductive through holes 116a.

To be more specific, the light emitting device 100a in the present embodiment further includes an insulating layer 130 disposed on the electrode connection layer 120a and insulating from the first electrode 122a and the second electrode 124a, wherein the at least one buffer region S locates among the insulating layer 130, the connection layer 126a, and the substrate 110a. Furthermore, the epitaxial structure E in the present embodiment further includes a first type semiconductor layer 140, a light emitting layer 150, and a second type semiconductor layer 160. The first type semiconductor layer 140 is disposed on the insulating layer 130, and the first electrode 122a penetrates through the insulating layer 130 and is electrically connected to the first type semiconductor layer 140. The light emitting layer 150 is disposed on the first type semiconductor layer 140. The second type semiconductor layer 160 is disposed on the light emitting layer 150, and the second electrode 124a penetrates through the insulating layer 130, the first type semiconductor layer 140 and the light emitting layer 150 so as to electrically connect to the second type semiconductor layer 160.

To be more specific, the substrate 110a of the present embodiment can have a good heat dissipation efficiency, the thermal conductivity coefficient of the substrate 110a is greater than 10 W/m-K, and the substrate 110a can also be an insulation substrate with resistivity greater than $10^{10}$ Ω·m. In the present embodiment, the substrate 110a is, for example, a ceramic substrate or a sapphire substrate. Preferably, the substrate 110a is a ceramic substrate with a good heat dissipation effect and insulation effect. The thickness of the substrate 110a is, for example, between 100 μm and 700 μm, and preferably between 100 μm and 300 μm. As shown in FIG. 1A, the conductive through holes 116a of the present embodiment are formed by filling a conductive material such as copper, gold, etc in the through holes of the substrate 110a. The two opposite ends of the conductive through holes 116a of the substrate 110a are electrically connected to the electrode connection layer 120a and the pads 170 respectively, and the cross-sectional profile of the conductive through holes 116a may have different shapes according to the fabrication method thereof. For example, if a mechanical drilling method is adopted, the presented cross-sectional profile of each of the conductive through holes 116a is a rectangle (not shown); if a laser drilling method is adopted, the presented cross-sectional profile of each of the conductive through holes 116a is a trapezoid, which is shown in FIG. 1A. However, if the laser drilling method is adopted, an ablation direction of laser light also influences the cross-sectional profile of the conductive through holes. For example, if the laser light irradiates the upper surface 112 of the substrate 110a, the cross-sectional profile of each of the conductive through holes 116a presents an inverted trapezoid with a wide opening at top and a narrow opening at bottom (not shown); and if the laser light irradiates the lower surface 114 of the substrate 110a, the cross-sectional profile of each of the conductive through holes 116a presents a trapezoid with a narrow opening at top and a wide opening at bottom, which is shown in FIG. 1A. The cross-sectional profiles of the conductive through holes 116a are all within a protection range of the invention, and the invention is not limited to the cross-sectional profiles of the conductive through holes 116a shown in the present embodiment.

Moreover, the first electrode 122a of the electrode connection layer 120a of the present embodiment is, for example, a P-type electrode, and the second electrode 124a is, for example, an N-type electrode, though the invention is not limited thereto. The material of the first electrode 122a and the second electrode 124a can be selected from titanium, tin, indium, chromium, platinum, gold, an alloy of materials selected from above materials, or a combination of the above materials. However, the connection layer 126a is disposed between the substrate 110a and the first electrode 122a and disposed between the substrate 110a and the second electrode 124a, and the material of the connection layer 126a can be selected from titanium, gold, indium, tin, chromium, platinum, an alloy of materials selected from above materials or a combination of the above materials. It should be noticed that the first electrodes 122a, the second electrodes 124a and the connection layer 126a can be made of a same material, different materials, and can be made integrally or separately, which is not limited by the invention. In the present embodiment shown in FIG. 1A, the area of the orthogonal projection of the portion of the connection layer 126a connecting to the second electrode 124a on the substrate 110a is greater than the area of the orthogonal projection of the portion of the connection layer 126a connecting to the first electrode 122a on the substrate 110a. In other words, the area of the portion of the connection layer 126a connecting to the second electrode 124a is greater than the area of the portion of the connection layer 126a connecting to the first electrode 122a. Specifically, the first electrode 122a and the second electrode 124a in the present embodiment are located on the same side which is a side of the first type semiconductor layer 140.

Figure 1B:
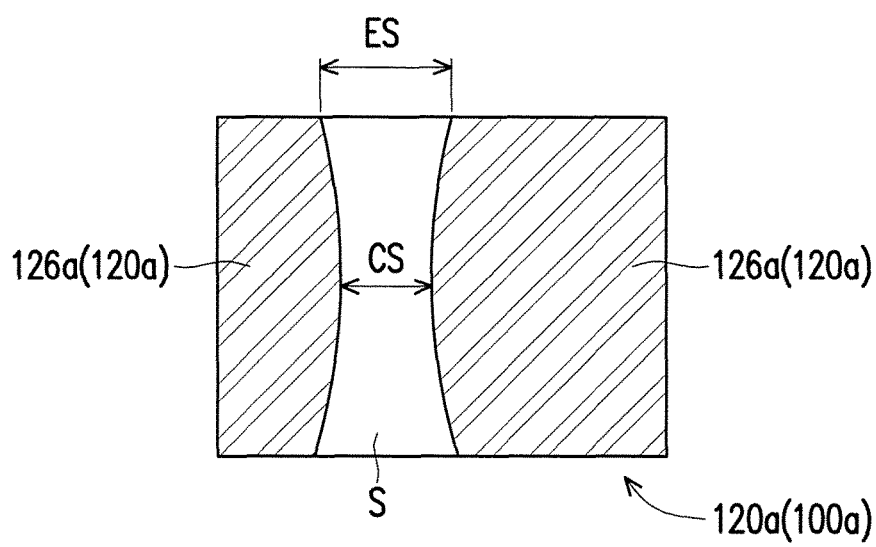
FIG. 1B is a schematic top view illustrating a connection layer of a light emitting device according to one embodiment of the invention.

In the present embodiment, the buffer region S locates among the connection layer 126a, the substrate 110a, and the insulating layer 130. FIG. 1B is a schematic top view illustrating a connection layer of a light emitting device according to one embodiment of the invention. Referring to FIG. 1B, the thickness of the buffer region S is embodied by the distance between the portion of the connection layer 126a connecting to the first electrode 122a and the portion of the connection layer 126a connecting to the second electrode 124a. Because a center width CS of the buffer region S in the light emitting device 100a is smaller than an edge width ES of the buffer region S in the light emitting device 100a, the buffer region area close to the edge of the light emitting device 100a is greater than the buffer region area at the center of the light emitting device 100a, so that the stress between the substrate 110a and the connection layer 126a is easily released on the edge of the light emitting device 100a and can not be accumulated inside the light emitting device 100a.

Referring to FIG. 1A again, the pads 170 have a distance therebetween, and the width of the buffer region S is 0.1 to 1 times the distance between the pads 170. Preferably, the buffer region S is a gap, and the width of the gap is 0.3 to 0.7 times the distance between the pads 170. Since the thickness of the buffer region S is smaller than the distance between the pads 170, the area of the connection layer 126a become larger, so as to provide a good connection between the connection layer 126a and the substrate 110a, to transfer the thermal energy generated by the epitaxial structure E to the substrate 110a faster, and to avoid high temperature and decreasing light emitting efficiency of the epitaxial structure E. Because the environment temperature in the fabrication process can vary, the buffer region S can serve as a buffer between the electrode connection layer 120a and other layers having different thermal expansion coefficient, such as the substrate 110a, the conductive through hole 116a, or the insulating layer 130, so as to increase the positioning accuracy between the electrode connection layer 120a and other layers, and to increase the reliability of the light emitting device 100a in the present embodiment. It should be noted that, the area of the orthogonal projection of the buffer region S and the connection layer 126a on the substrate 110a is equal to the area of the upper surface 112 of the substrate 110.

In addition, the epitaxial structure E in the present embodiment, the first type semiconductor layer 140 is, for example, a P-type type semiconductor layer, and the second type semiconductor layer 160 is, for example, an N-type type semiconductor layer, but the invention is not limited thereto. In addition, the edge of the epitaxial structure E is smaller than or equal to the edge of the substrate 110a, preferably the projected area of the epitaxial structure E on the substrate 110a is 0.8 to 1 times the area of the upper surface 112 of the substrate 110a. The thickness of the epitaxial structure E is between 3 μm and 15 μm, and preferably between 4 μm and 8 μm. Otherwise, since the pads 170 in the present embodiment are located on the lower surface 114 of the substrate 110a, the light emitting device 100a can be connected to an external circuit (not shown)

through the pads 170, the heat generated by the light emitting device 100a can be transferred quickly through the pads 170 to the outside. Otherwise, an edge 121 of the electrode connection layer 120a and an edge 111 of the substrate 110a are aligned in the present embodiment as shown in FIG. 1A. Therefore, the total thickness of the light emitting device 100a in the present embodiment becomes smaller, so that the volume of the light emitting device 100a also becomes smaller.

It should be noticed that reference numbers of the components and a part of contents of the aforementioned embodiment are also used in the following embodiment, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 2A:
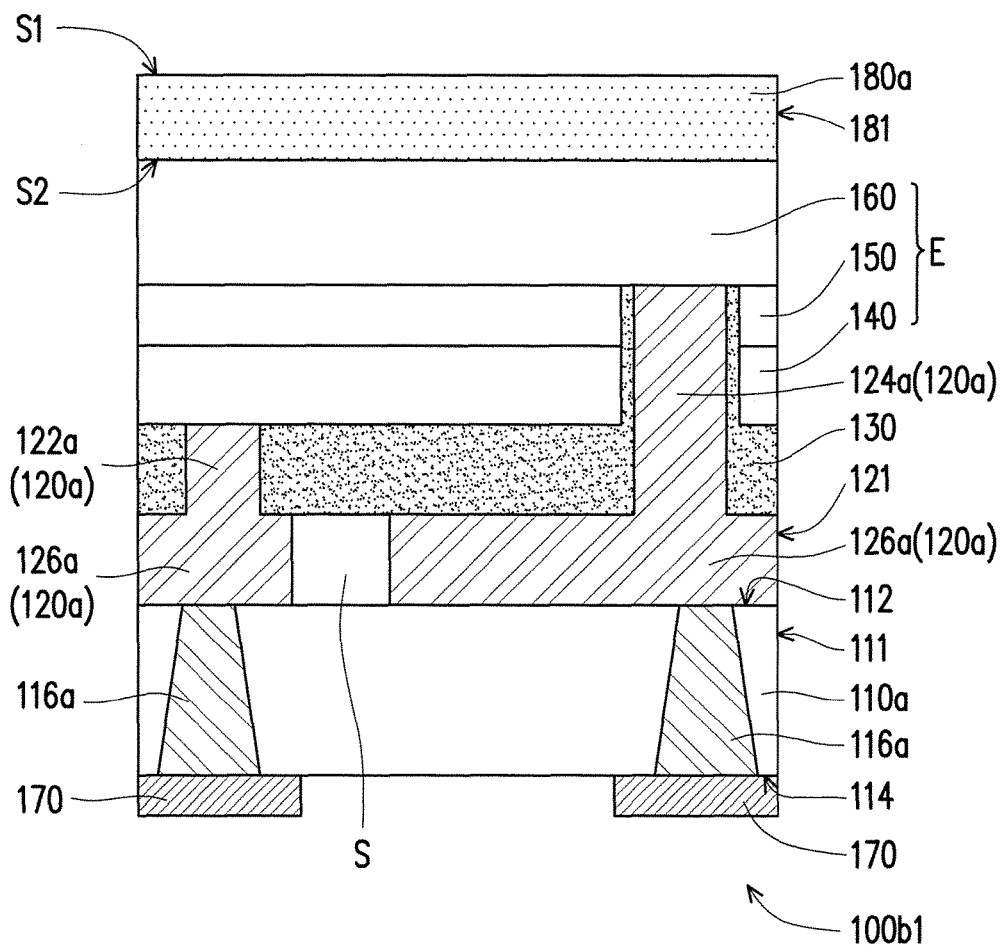
FIG. 2A and FIG. 2B are schematic cross-sectional views of light emitting devices according to another two embodiments of the invention.

FIG. 2A is a cross-sectional view of a light emitting device according to another embodiment of the invention. Referring to FIG. 1A and FIG. 2A, the light emitting device 100b1 of the present embodiment is similar to the light emitting device 100a in FIG. 1A, and a main difference therebetween is that the light emitting device 100b1 of the present embodiment further includes a sheet-like wavelength converting layer 180a disposed on the epitaxial structure E, and an edge 181 of the sheet-like wavelength converting layer 180a and an edge 111 of the substrate 110a are substantially aligned. Herein, the extending direction of the sheet-like wavelength converting layer 180a and the extending direction of the substrate 110a are substantially the same. As shown in FIG. 2A, the extending direction of the sheet-like wavelength converting layer 180a and the extending direction of the substrate 110a are all lateral extending directions, and the sheet-like wavelength converting layer 180a has two opposite flat surfaces S1, S2. In other words, the sheet-like wavelength converting layer 180a of the present embodiment substantially is a planar structure. Moreover, a thickness of the sheet-like wavelength converting layer 180a of the present embodiment is between 5 μm and 80 μm, and preferably between 20 μm and 60 μm. Herein, the sum of the thickness of the sheet-like wavelength converting layer 180a and the thickness of the epitaxial structure E is preferably smaller than 100 μm. Compared to the conventional light emitting device that the epitaxial structure has a thickness of more than 100 μm, the light emitting device 100b1 of the present embodiment can have a smaller volume.

Since the sheet-like wavelength converting layer 180a of the present embodiment is embodied by a planar structure, the edge 181 of the sheet-like wavelength converting layer 180a and the edge 111 of the substrate 110a are substantially aligned. Therefore, compared to the conventional method that a molding compound is used to package the light emitting chip to form an arc-shaped molding compound of the light emitting device, the light emitting device 100b1 in the present embodiment can have a smaller volume. Moreover, in order to improve a light emitting efficiency of the whole light emitting device 100b1, diffusing particles or reflecting particles can be added to the sheet-like wavelength converting layer 180a, so as to achieve a light scattering effect and a light reflecting effect, which is still within the protection range of the invention. In addition, since the sheet-like wavelength converting layer 180a of the present embodiment is embodied by a planar structure, a light emitting angle of the whole light emitting device 100b1 is, for example, smaller than 140 degrees, so that the light emitting device 100b1 has a good light source collimation property, and has good flexibility in application of subsequent optical design.

Figure 2B:
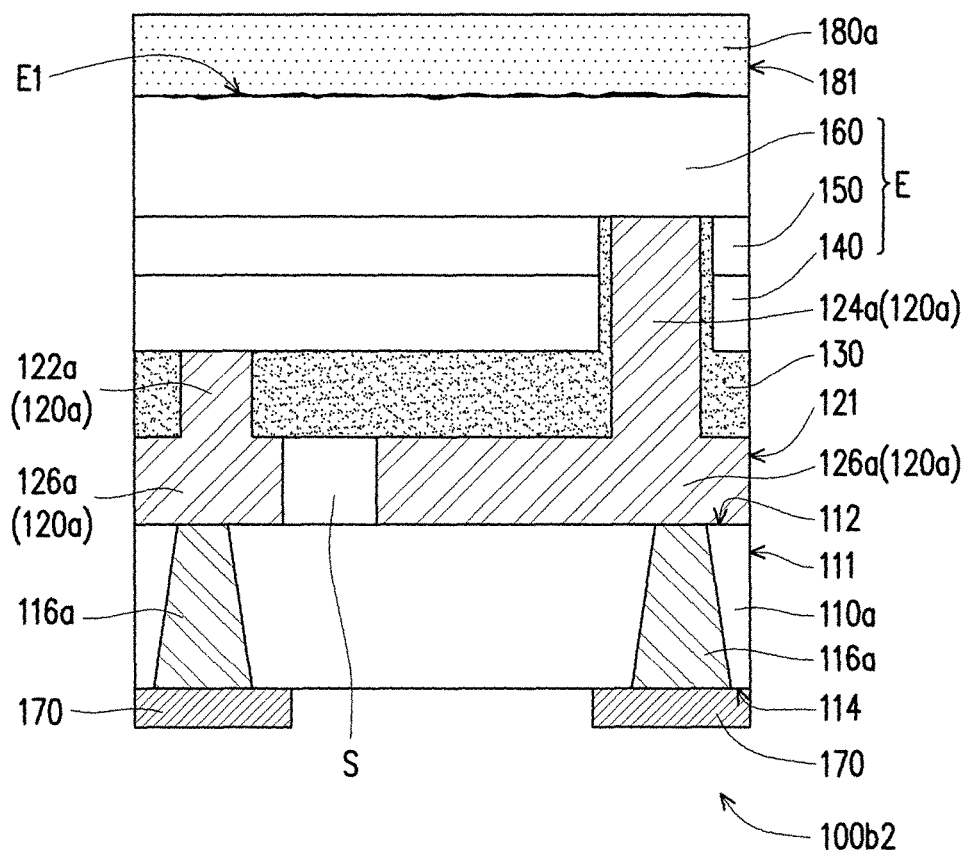

FIG. 2B is a schematic cross-sectional view of a light emitting device according to another embodiment of the invention. Referring to FIG. 2A and FIG. 2B, the light emitting device 100b2 of the present embodiment is similar to the light emitting device 100b1 in FIG. 2A, and a main difference therebetween is that the epitaxial structure E of the light emitting device 100b2 of the present embodiment has a rough surface E1, and the rough surface E1 and the sheet-like wavelength converting layer 180a have micron-scale voids therebetween. Namely, the surface of the epitaxial structure E contacting the sheet-like wavelength converting layer 180a is a non-flat surface, the light generated by the epitaxial structure E has a scattering effect through the micron-scale voids, and according to such design, the light generated by the epitaxial structure E has the scattering effect, so as to improve the light emitting uniformity of the whole light emitting device 100b2 effectively. Moreover, the micron-scale voids between the epitaxial structure E and the sheet-like wavelength converting layers 180a can serve as a buffer therebetween, so that the epitaxial structure E and the sheet-like wavelength converting layer 180a have a good bonding effect therebetween, so as to improve reliability of the light emitting device 100b2. It should be noted that if the size of the voids between the epitaxial structure E and the sheet-like wavelength converting layer 180a is smaller than the micro-scale, for example, smaller than 0.1 μm, the voids are too small, the scattering effect is not good, and if the size of the voids is greater than the micro-scale, for example, greater than 10 μm, the voids are too large, and a bonding effect between the epitaxial structure E and the sheet-like wavelength converting layer 180a is not good.

Figure 3A:
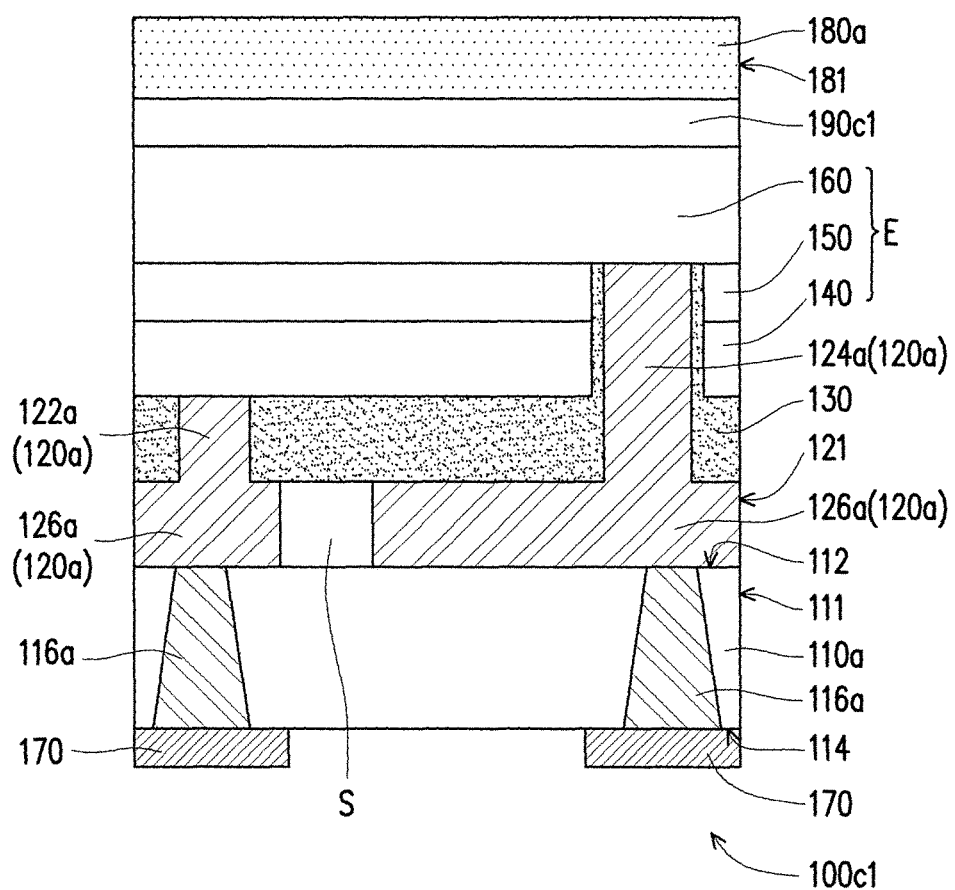
FIG. 3A, FIG. 3B, and FIG. 3C are schematic cross-sectional views of light emitting devices according to another three embodiments of the invention.

FIG. 3A is a schematic cross-sectional view of a light emitting device according to another embodiment of the invention. Referring to FIG. 2A and FIG. 3A, the light emitting device 100c1 of the present embodiment is similar to the light emitting device 100b1 in FIG. 2A, and a main difference therebetween is that the light emitting device 100c1 of the present embodiment further includes an optical coupling layer 190c1, and the optical coupling layer 190c1 is disposed between the sheet-like wavelength converting layer 180a and the second type semiconductor layer 160 of the epitaxial structure E, so as to increase light emitting efficiency of the light emitting device 100c1. Herein, the optical coupling layer 190c1 has a thickness smaller than 10 μm, and can serve as a buffer between the epitaxial structure E and the sheet-like wavelength converting layer 180a, and implement a good bonding effect between the epitaxial structure E and the sheet-like wavelength converting layer 180a. Herein, an edge of the optical coupling layer 190c1 is aligned with an edge of the second type semiconductor layer 160 of the epitaxial structure E.

Moreover, the material of the optical coupling layer 190c1 of the present embodiment is, for example, nitride material, such as gallium nitride; or the material of the optical coupling layer 190c1 is the same as the material of the second type semiconductor layer 160, so as to have a good bonding effect, but the invention is not limited thereto. In addition, in order to increase the light emitting efficiency of the whole light emitting device 100c1, the material of the optical coupling layer 190c1 can be a material having a similar refractive index to the second type semiconductor layer 160, the refractive index of the optical coupling layer 190c1 can be changed to be smaller than the refractive index of the second type semiconductor layer 160 and to be greater than the refractive index of the sheet-like wavelength converting layer 180a by adding diffusing particles, reflective particles, scattering particles, or at least two types of the mentioned particles to the optical coupling layer 190c1, so as to increase light emitting efficiency, which is still within the protection range of the invention.

Figure 3B:
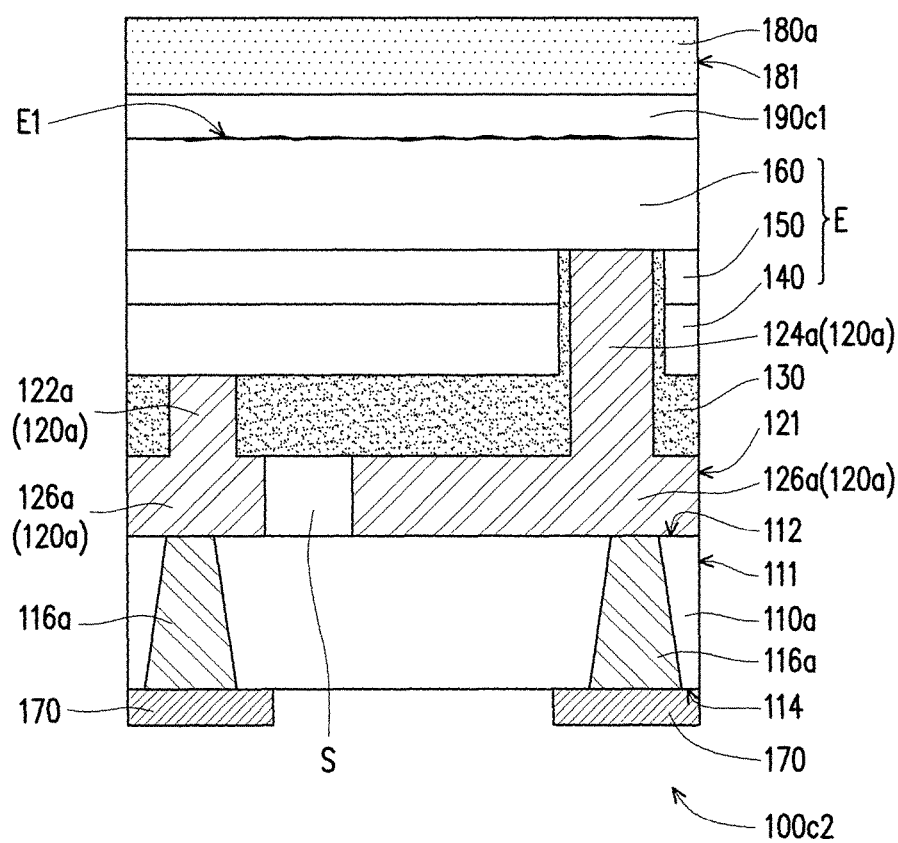

FIG. 3B is a schematic cross-sectional view of a light emitting device according to another embodiment of the invention. Referring to FIG. 3A and FIG. 3B, the light emitting device 100c2 of the present embodiment is similar to the light emitting device 100c1 in FIG. 3A, and a main difference therebetween is that the optical coupling layer E of the light emitting device 100c2 of the present embodiment has a rough surface E1, and the rough surface E1 and the optical coupling layer 190c1 have micron-scale voids therebetween. The contact surface between the epitaxial structure E and the optical coupling layer 190c1 is a non-flat surface. Since the light generated by the epitaxial structure E through the micron-scale voids has a scattering effect, so that the light ray can enter the optical coupling layer 190c1 uniformly, and according to such design, the light generated by the epitaxial structure E has a better scattering effect, so as to improve the light emitting uniformity of the whole light emitting device 100c2 effectively. In addition, the voids between the optical coupling layer 190c1 and the epitaxial structure E can serve as a buffer space between the two different layers, so that the epitaxial structure E and the optical coupling layer 190c1 have a good bonding effect therebetween. It should be noted that if the size of the voids between the epitaxial structure E and the optical coupling layer 190c1 is smaller than the micro-scale, for example, smaller than 0.1 μm, the voids are too small, the scattering effect is not good, and if the size of the voids is greater than the micro-scale, for example, greater than 10 μm, the voids are too large, and a bonding effect between the epitaxial structure E and the optical coupling layer 190c1 is not good.

Figure 3C:
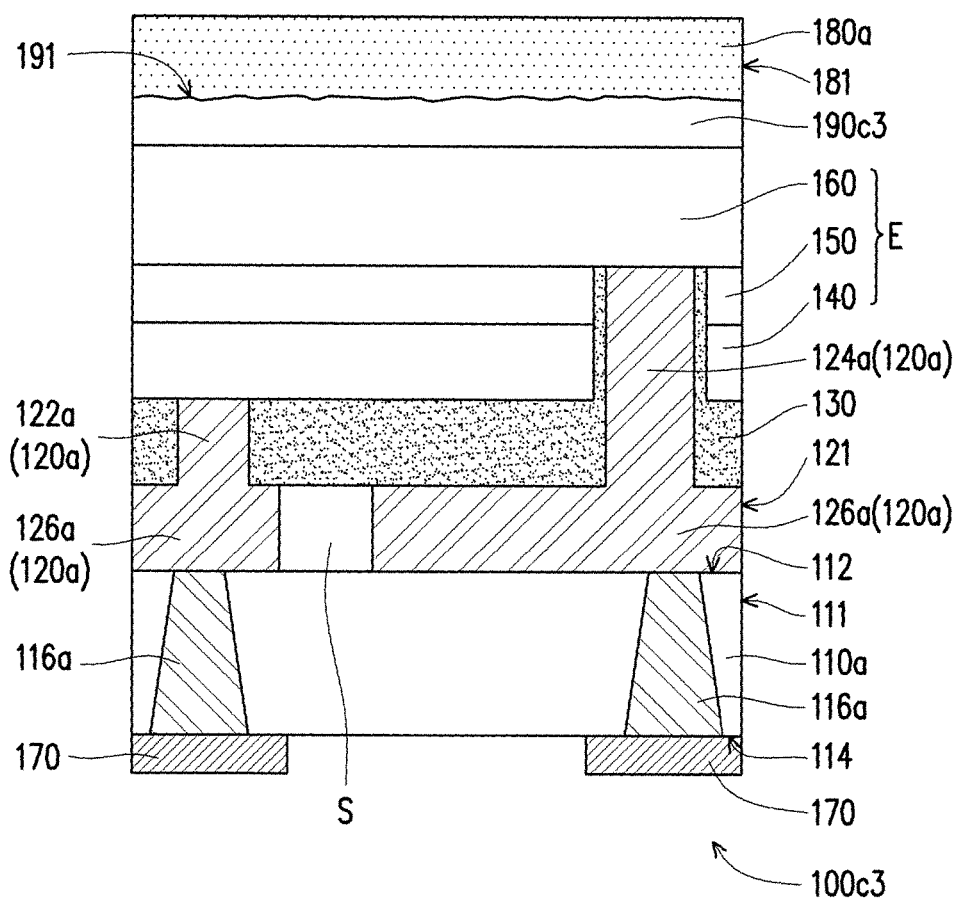

FIG. 3C is a schematic cross-sectional view of a light emitting device according to another embodiment of the invention. Referring to FIG. 3C and FIG. 3A, the light emitting device 100c3 of the present embodiment is similar to the light emitting device 100c1 in FIG. 3A, and a main difference therebetween is that the optical coupling layer 190c3 of the light emitting device 100c3 has a rough surface 191, and the rough surface 191 and the sheet-like wavelength converting layer 180a or the epitaxial structure E have micron-scale voids therebetween. Herein, the rough surface 191 and the sheet-like wavelength converting layer 180a have micron-scale voids therebetween. Namely, the surface of the optical coupling layer 190c3 contacting the sheet-like wavelength converting layer 180a is a non-flat surface, and according to such design, the light generated by the epitaxial structure E has a better scattering effect, so as to improve the light emitting uniformity of the whole light emitting device 100c3 effectively. Moreover, the micron-scale voids between the optical coupling layer 190c3 and the sheet-like wavelength converting layer 180a can serve as a buffer space between the two different layers, so that the optical coupling layer 190c3 and the sheet-like wavelength converting layer 180a have a good bonding effect therebetween, so as to improve the reliability of the light emitting device 100c3. It should be noted that the optical coupling layer 190c3 can have two rough surfaces, one rough surface and the sheet-like wavelength converting layer 180a can have micron-scale voids therebetween, and simultaneously another rough surface and the epitaxial structure E can have micron-scale voids therebetween (not shown), so as to achieve a good bonding effect between the optical coupling layer 190c3, the sheet-like wavelength converting layer 180a, and the epitaxial structure E and improve the reliability of the light emitting device 100c3, but the invention is not limited thereto.

Figure 4:
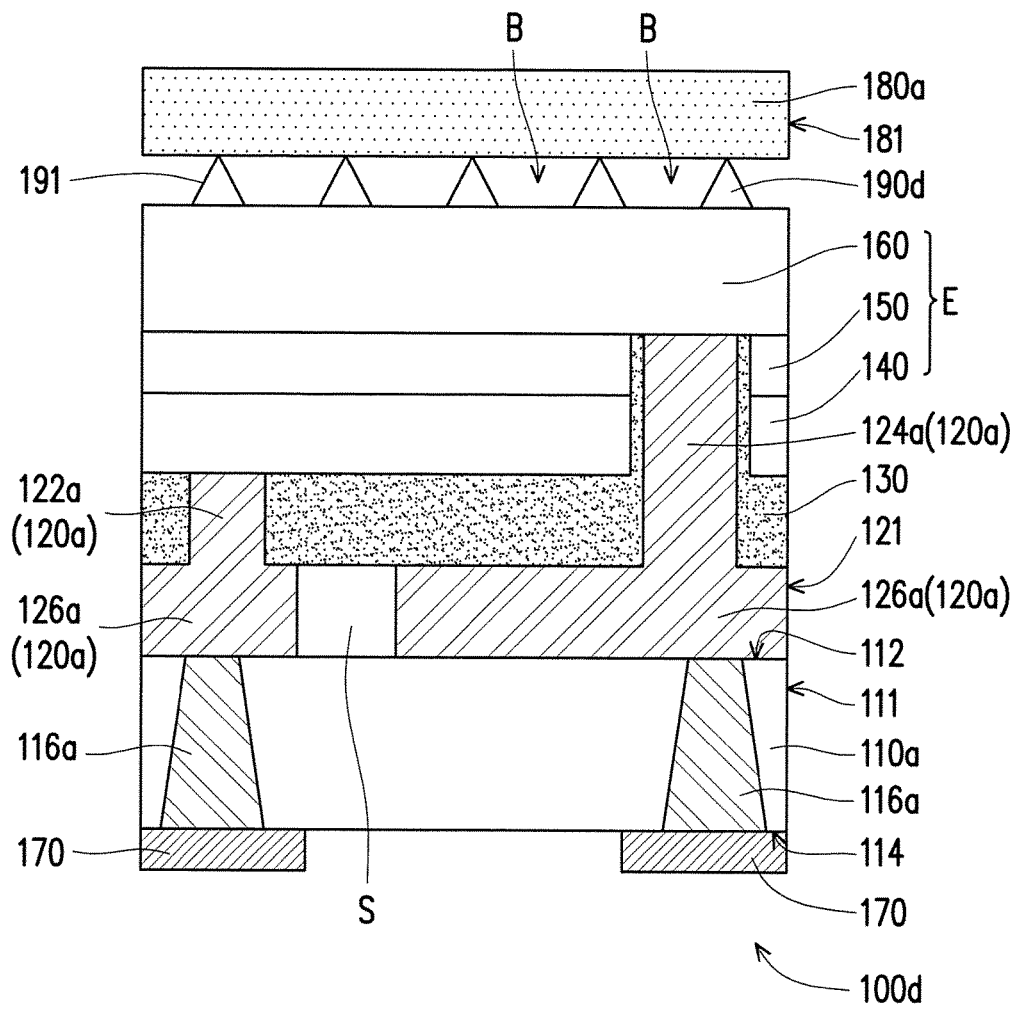
FIG. 4 is a schematic cross-sectional view of a light emitting device according to another embodiment of the invention.

FIG. 4 is a schematic cross-sectional view of a light emitting device according to another embodiment of the invention. Referring to FIG. 4 and FIG. 2A, the light emitting device 100d of the present embodiment is similar to the light emitting device 100b1 in FIG. 2A, and a main difference therebetween is that the light emitting device 100d of the present embodiment further includes an optical coupling layer 190d, and the optical coupling layer 190d is located between the sheet-like wavelength converting layer 180a and the second type semiconductor layer 160 of the epitaxial structure E and has a patterned rough surface 191. The optical coupling layer 190d and the sheet-like wavelength converting layer 180a have at least one void B therebetween. As shown in FIG. 4, the optical coupling layer 190d of the present embodiment has a cross-sectional pattern, which is a structure constructed by a periodic triangular pattern, and a void B exists between two adjacent triangular patterns; however, in other not shown embodiments, the cross-sectional pattern of the optical coupling layer can have different shapes and can be arranged non-periodically, which is still within the protection range of the invention. Since the optical coupling layer 190d and the sheet-like wavelength converting layer 180a have a non-flat contact, based on such design, the light generated by the epitaxial structure E has the better scattering effect, so as to improve the light emitting uniformity of the whole light emitting device 100d. Moreover, the space between the optical coupling layer 190d and the sheet-like wavelength converting layer 180a can serve as a buffer space between two different layers, so that the epitaxial structure E and the sheet-like wavelength converting layer 180a have a good bonding effect therebetween, so as to improve the reliability of the light emitting device 100d.

Figure 5:
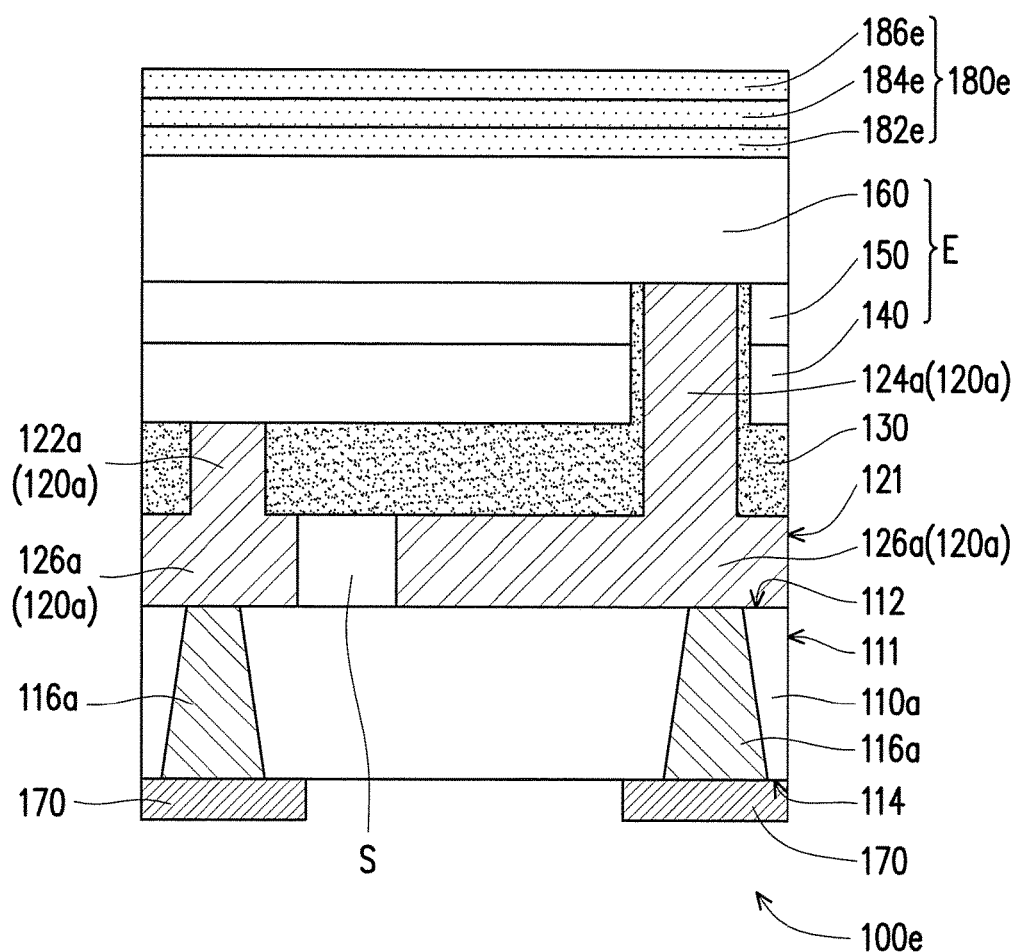
FIG. 5 is a schematic cross-sectional view of a light emitting device according to another embodiment of the invention.

FIG. 5 is a schematic cross-sectional view of a light emitting device according to another embodiment of the invention. Referring to FIG. 5 and FIG. 2A, the light emitting device 100e of the present embodiment is similar to the light emitting device 100b1 in FIG. 2A, and a main difference therebetween is that the sheet-like wavelength converting layer 180e of the light emitting device 100e includes at least two sheet-like wavelength converting unit layers, and the emission peak wavelengths of the sheet-like wavelength converting unit layers are progressively decreased along a direction away from the epitaxial structure E. In the present embodiment, the at least two sheet-like wavelength converting unit layers are three sheet-like wavelength converting unit layers, and the sheet-like wavelength converting unit layers include a first sheet-like wavelength converting unit layer 182e, a second sheet-like wavelength converting unit layer 184e and a third sheet-like wavelength converting unit layer 186e sequentially stacked on the second type semiconductor layer 160. The emission peak wavelength of the first sheet-like wavelength converting unit layer 182e is greater than the emission peak wavelength of the second sheet-like wavelength converting unit layer 184e, and the emission peak wavelength of the second sheet-like wavelength converting unit layer 184e is greater than the emission peak wavelength of the third sheet-like wavelength converting unit layer 186e. With this arrangement, the light transformed by passing through the first sheet-like wavelength converting unit layer 182e having greater emission peak wavelength can not be absorbed by the second and the third sheet-like wavelength converting unit layers 184e, 186e having shorter emission peak wavelength, etc. For example, when the epitaxial structure E emits a blue light, the first sheet-like wavelength converting unit layer 182e is, for example, a red light sheet-like wavelength converting unit layer, the second sheet-like wavelength converting unit layer 184e is, for example, a yellow light sheet-like wavelength converting unit layer, and the third sheet-like wavelength converting unit layer 186e is, for example, a green light sheet-like wavelength converting unit layer, by which light emitting uniformity and color rendering of the whole light emitting device 100e are enhanced. Certainly, in other embodiments, the first sheet-like wavelength converting unit layer 182e, the second sheet-like wavelength converting unit layer 184e, and the third sheet-like wavelength converting unit layer 186e can be sheet-like wavelength converting unit layers of other colors, and the colors are not limited by the invention. Particularly, the extending direction of the first sheet-like wavelength converting unit layer 182e, the second sheet-like wavelength converting unit layer 184e and the third sheet-like wavelength converting unit layer 186e is the same to the extending direction of the substrate 110a. The first sheet-like wavelength converting unit layer 182e, the second sheet-like wavelength converting unit layer 184e, the third sheet-like wavelength converting unit layer 186e and the substrate 110a are all laterally extended planar structures, so that the whole light emitting device 100e has a smaller volume.

Figure 6:
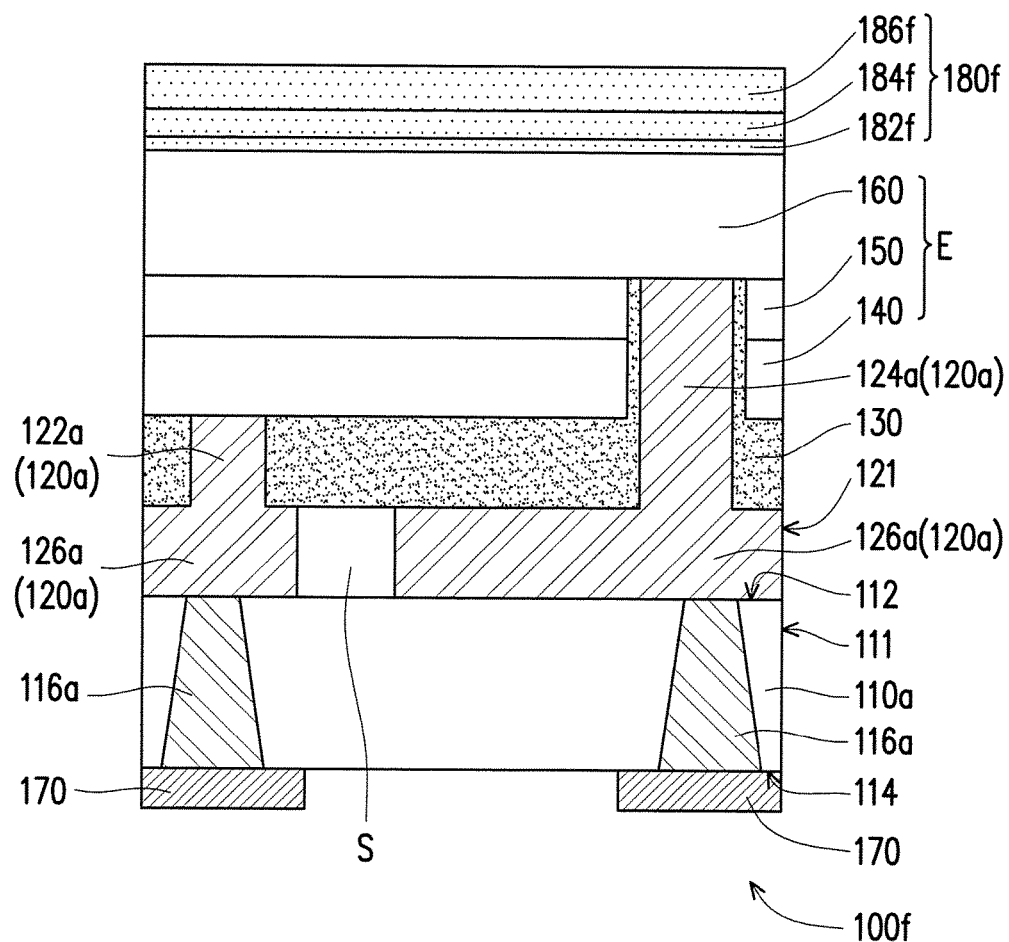
FIG. 6 is a schematic cross-sectional view of a light emitting device according to another embodiment of the invention.

FIG. 6 is a schematic cross-sectional view of a light emitting device according to another embodiment of the invention. Referring to FIG. 6 and FIG. 5, the light emitting device 100f of the present embodiment is similar to the light emitting device 100e of FIG. 5, and a main difference therebetween is that in the sheet-like wavelength converting layer 180f of the present embodiment, a thickness of the first sheet-like wavelength converting unit layer 182f, a thickness of the second sheet-like wavelength converting unit layer 184f, and a thickness of the third sheet-like wavelength converting unit layer 186f are all different from each other. Preferably, the thickness of the sheet-like wavelength converting layers increase along a direction away from the epitaxial structure E. With this arrangement, the light transformed by passing through the first sheet-like wavelength converting unit layer 182f having greater emission peak wavelength can not be absorbed by the second and the third sheet-like wavelength converting unit layers 184f, 186f having shorter emission peak wavelength, so that every layers do not need to have the same thickness to achieve a high color rendering and a high efficiency of light emitting uniformity. For example, when the first sheet-like wavelength converting unit layer 182f is a red light sheet-like wavelength converting unit layer, the second sheet-like wavelength converting unit layer 184f is a green light sheet-like wavelength converting unit layer, and the thickness of the first sheet-like wavelength converting unit layer 182f is 0.2 to 0.4 times the thickness of the second sheet-like wavelength converting unit layer 184f, a usage amount of red phosphor powder with higher cost is decreased, so as to effectively decrease a manufacturing cost of the whole light emitting device 100f.

Figure 7A:
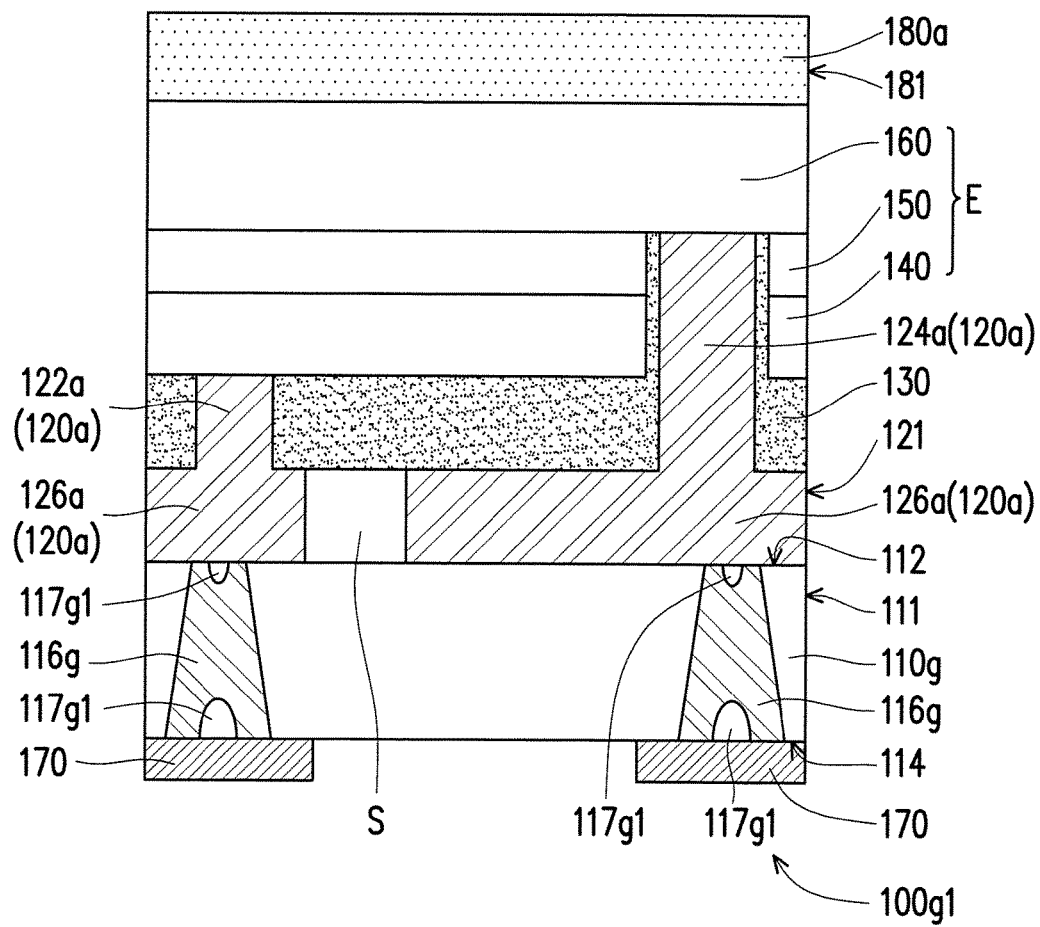
FIG. 7A-7C are schematic cross-sectional views of light emitting devices according to a plurality of embodiments of the invention.

FIG. 7A is a schematic cross-sectional view of a light emitting device according to another embodiment of the invention. Referring to FIG. 7A and FIG. 2A, the light emitting device 100g1 of the present embodiment is similar to the light emitting device 100b1 in FIG. 2A, and a main difference therebetween is that each of the conductive through holes 116g of the substrate 110g in the present embodiment has at least one space 117g1 (two spaces are shown in FIG. 7). Moreover, the space 117g1 can be a buffer between layers having different thermal expansion coefficients under processes in different temperatures, such as between the conductive through hole 116g and the electrode connection layer 120a, and between the conductive through hole 116g and the pad 170. The spaces 117g1 in FIG. 7A can be close to or connected to the upper surface 112 or the lower surface 114 of the substrate 110g, but the invention is not limited thereto.

Figure 7B:
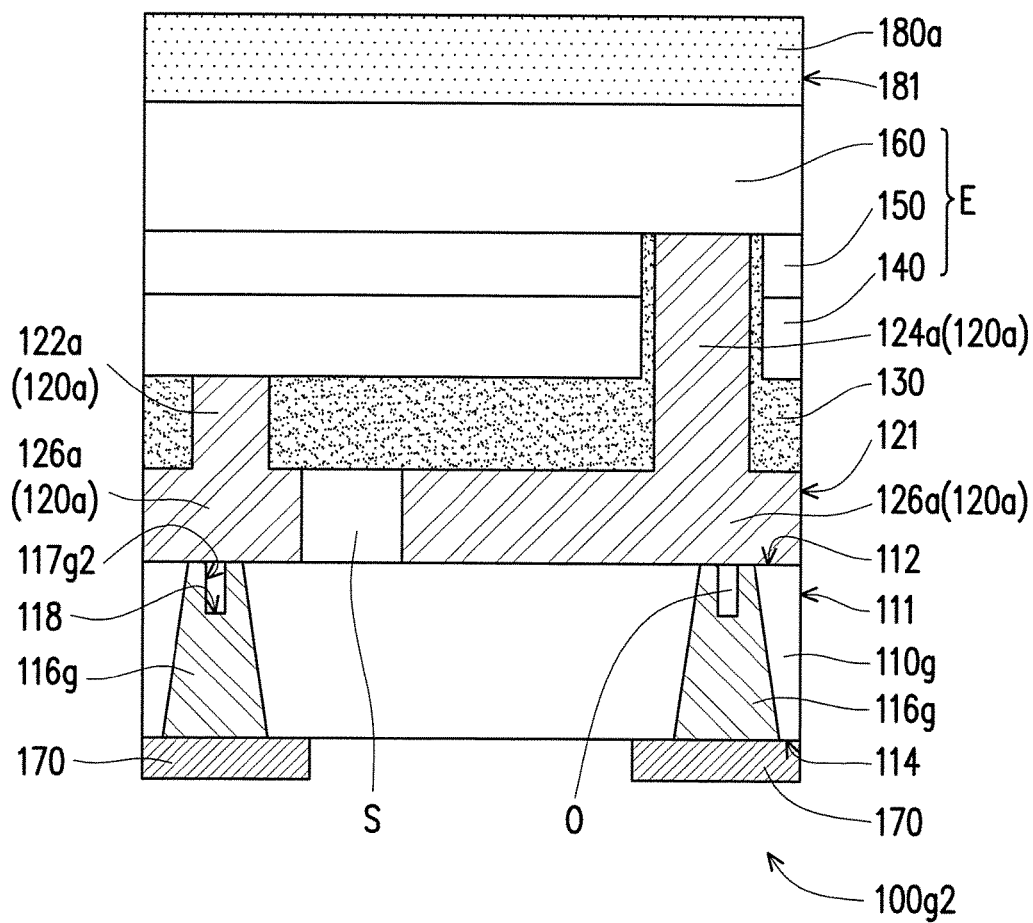

FIG. 7B is a schematic cross-sectional view of a light emitting device according to another embodiment of the invention. Referring to FIG. 7B and FIG. 7A, the light emitting device 100g2 of the present embodiment is similar to the light emitting device 100g1 in FIG. 7A, and a main difference therebetween is that the space 117g2 of each of the conductive through holes 116g in the present embodiment extends along a direction from the upper surface 112 of the substrate 110g to the lower surface 114 thereof and has a bottom surface 118. In other words, the space 117g2 of each of the conductive through holes 116g has an opening O facing the upper surface 112. The opening O connects the conductive through hole 116g and the electrode connection layer 120a, and can serve as a buffer between two layers with different thermal expansion coefficients such as the conductive through hole 116g and the electrode connection layer 120a under processes in different temperatures.

Figure 7C:
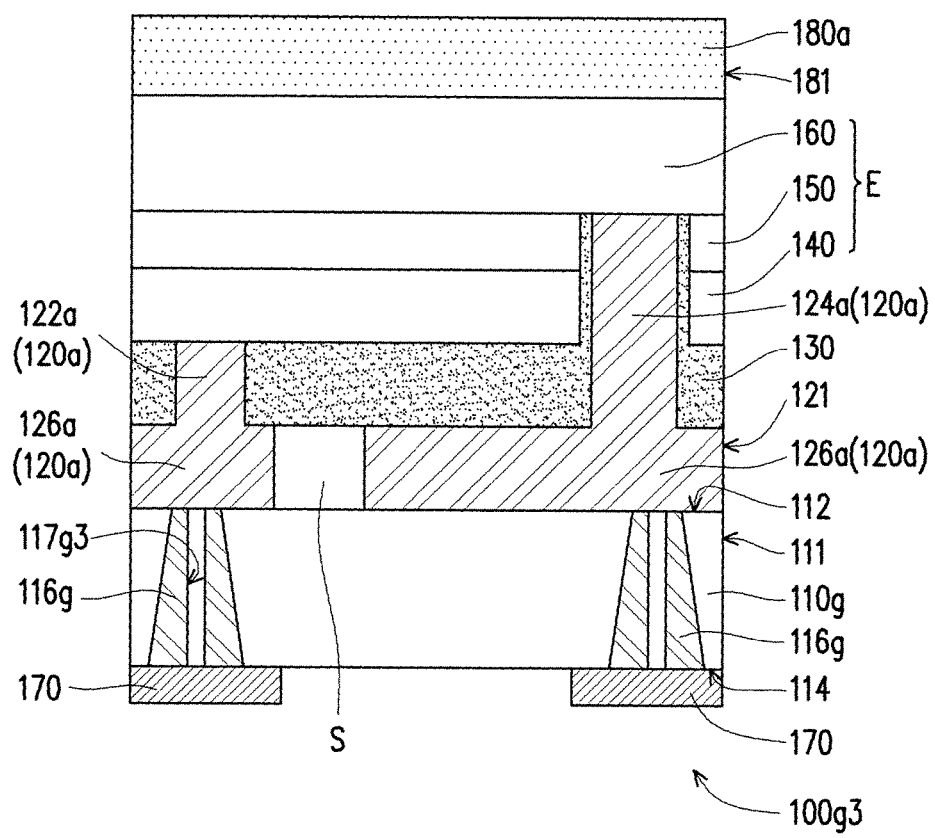

FIG. 7C is a schematic cross-sectional view of a light emitting device according to another embodiment of the invention. Referring to FIG. 7C and FIG. 7A, the light emitting device 100g3 of the present embodiment is similar to the light emitting device 100g1 in FIG. 7A, and a main difference therebetween is that the space 117g3 of each of the conductive through holes 116g of the present embodiment is a through hole penetrating through the substrate 110g and connecting the upper surface 112 and the lower surface 114. In other embodiments that are not illustrated, the spaces 117g1, 117g2, 117g3 can exists inside the conductive through hole 116g without contacting the electrode connection layer 120a or the pads 170, and it is considered to be within the scope of the invention as long as a space exists between the conductive through hole 116a and the electrode connection layer 120a or the pads 170 to serve as a buffer.

Figure 8:
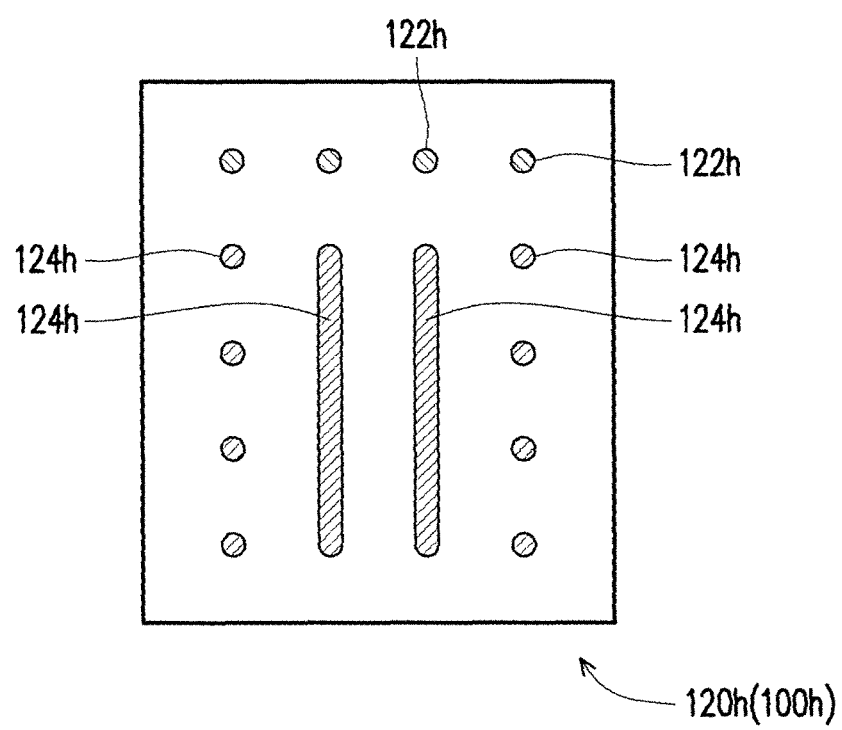
FIG. 8 is a schematic top view illustrating an electrode connection layer of a light emitting device according to another embodiment of the invention.

FIG. 8 is a schematic top view illustrating an electrode connection layer of a light emitting device according to another embodiment of the invention. Referring to FIG. 8, the light emitting device 100h of the present embodiment has a plurality of first electrodes 122h and a plurality of second electrodes 124h, a profile of each of the first electrodes 122h when viewing from atop is in a point shape, and a profile of the second electrodes 124h when viewing from atop is a combination of a point shape and a line shape. The second electrodes 124h of the present embodiment simultaneously have electrodes with a point-shaped profile and electrodes with a line-shaped profile, and as shown in FIG. 8, these electrode patterns are separated from each other. Since the portion of the second electrodes 124h contacting to the epitaxial structure E in the light emitting device 100h of the present embodiment have the electrode patterns with point shapes and line shapes, a current distribution can be more even and a forward voltage can be effectively decreased.

Figure 9:
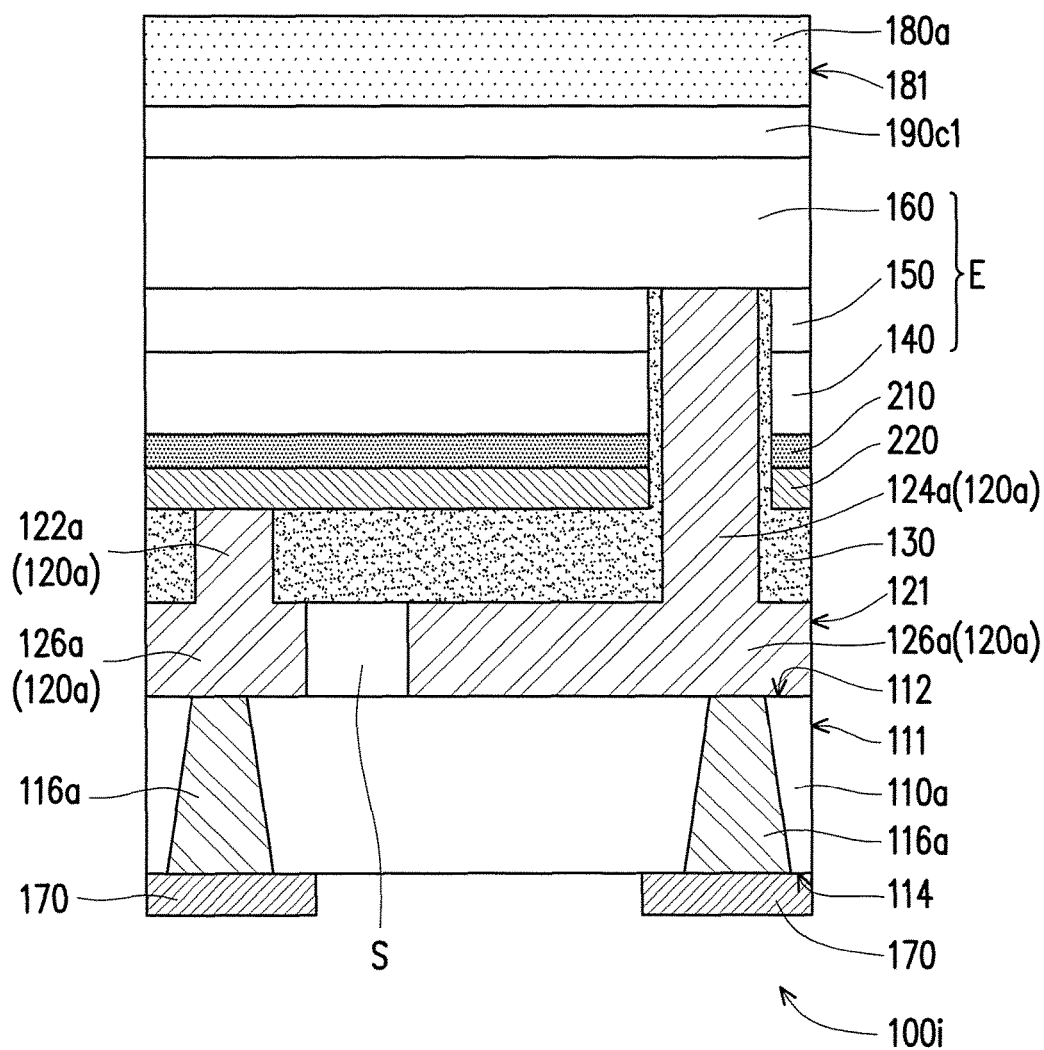
FIG. 9 is a schematic cross-sectional view of a light emitting device according to another embodiment of the invention.

FIG. 9 is a schematic cross-sectional view of a light emitting device according to another embodiment of the invention. Referring to FIG. 9 and FIG. 3A, the light emitting device 100i of the present embodiment is similar to the light emitting device 100c1 in FIG. 3A, and a main difference therebetween is that the light emitting device 100i of the present embodiment further includes an ohmic contact layer 210 disposed between the first type semiconductor layer 140 and the insulating layer 130. In addition, the light emitting device 100i further includes a reflection layer 220 disposed between the ohmic contact layer 210 and the insulating layer 130. Here, configuration of the ohmic contact layer 210 can effectively enhance electrical contact between the first type semiconductor layer 140 and the reflection layer 220, where a material of the ohmic contact layer 210 is, for example, nickel or nickel oxide. The material of the reflection layer 220 is, for example, silver, which is adapted to reflect the light of the light emitting layer 150 to achieve a good light emitting efficiency. Particularly, the ohmic contact layer 210 may have a patterned structure, such as a profile pattern embodied by a periodic island-shaped pattern (not shown), i.e. The spaces exist between the ohmic contact layer 210 and the first type semiconductor layer 140 and between the first electrode 122a and the reflection layer 220, so as to increase electrical connection and bonding between the ohmic contact layer 210 and the first type semiconductor layer 140 and between the first electrode 122a and the reflection layer 220. Moreover, a thickness of the ohmic contact layer 210 and a thickness of the reflection layer 220 of the present embodiment is, for example, between 1000 Å and 7000 Å, and preferably between 1000 Å and 3500 Å.

Figure 10:
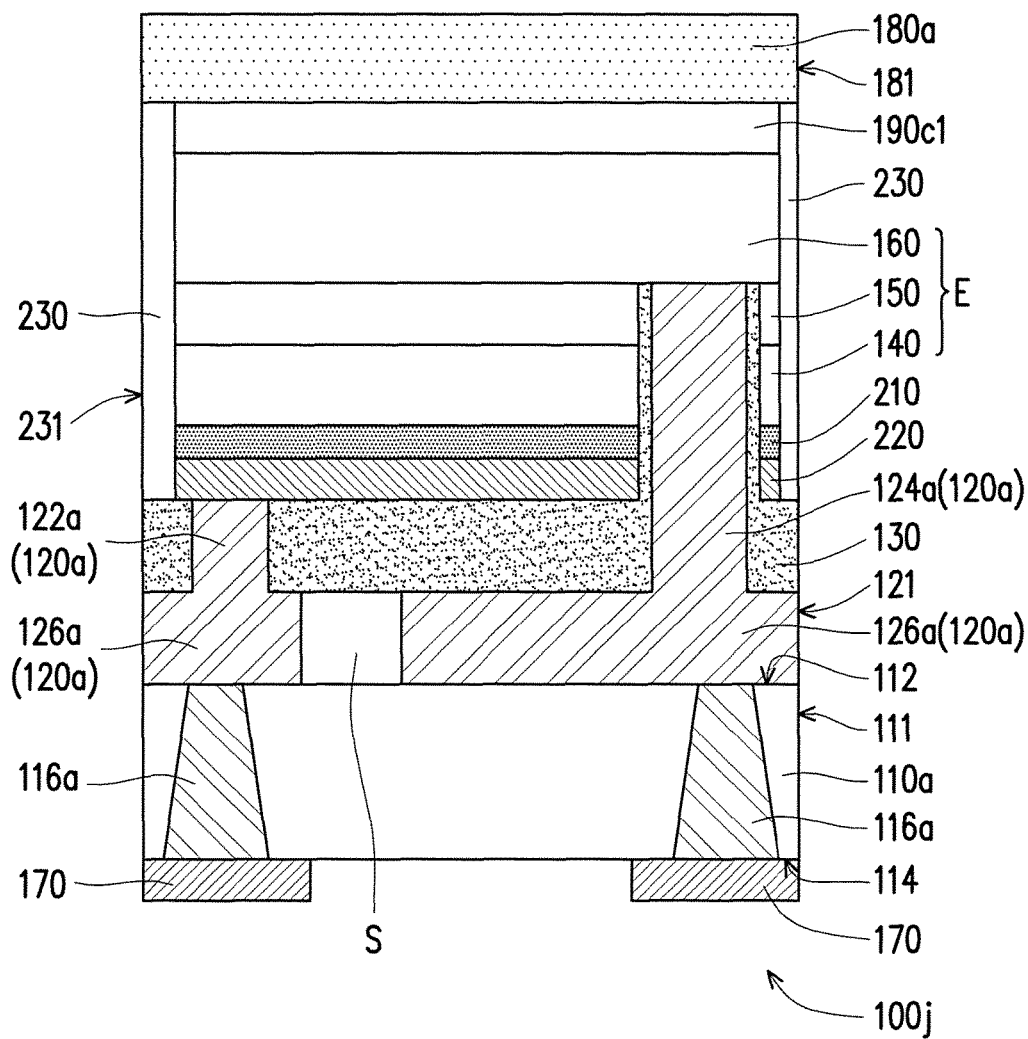
FIG. 10 is a schematic cross-sectional view of a light emitting device according to another embodiment of the invention.

FIG. 10 is a schematic cross-sectional view of a light emitting device according to another embodiment of the invention. Referring to FIG. 10 and FIG. 9, the light emitting device 100j of the present embodiment is similar to the light emitting device 100i in FIG. 9, and a main difference therebetween is that the light emitting device 100j of the present embodiment further includes an insulation protection layer 230 which covers an edge of the first type semiconductor layer 140, an edge of the light emitting layer 150, and the edge of the second type semiconductor layer 160, and an edge 231 of the insulation protection layer 230 and an edge of the insulating layer 130 are substantially aligned. Herein, the material of the insulation protection layer 230 can be silicon dioxide, silicon nitride, and a combination of two materials thereof. The insulation protection layer 230 is configured to effectively protect the edge of the epitaxial structure E, so as to avoid invasion of vapor and oxygen, and effectively improve product reliability of the whole light emitting device 100j. Particularly, the insulation protection layer 230 of the present embodiment further covers edges of the ohmic contact layer 210a and the reflection layer 220, so as to achieve better reliability of the light emitting device 100j. It should be noticed that the insulation protection layer 230 and the insulating layer 130 can be disposed integrally, which is not limited by the invention.

Figure 11:
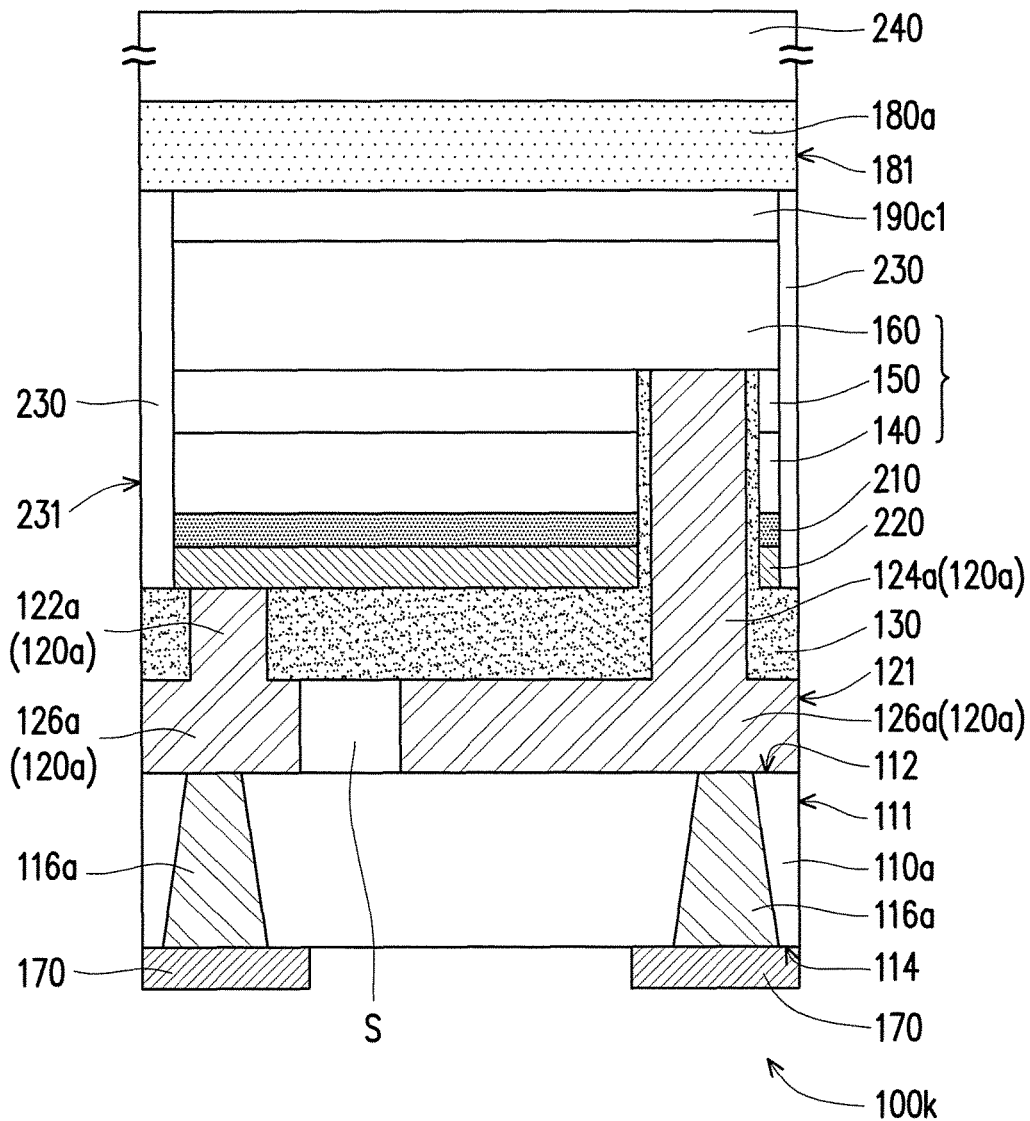
FIG. 11 is a schematic cross-sectional view of a light emitting device according to another embodiment of the invention.

FIG. 11 is a schematic cross-sectional view of a light emitting device according to another embodiment of the invention. Referring to FIG. 11 and FIG. 10, the light emitting device 100k of the present embodiment is similar to the light emitting device 100j in FIG. 11, and a main difference therebetween is that the light emitting device 100k of the present embodiment further includes a color mixing layer 240 disposed on the sheet-like wavelength converting layer 180a. In the present embodiment, the color mixing layer 240 is made of a transparent material, for example, glass, sapphire, epoxy resin or silicon, and a thickness of the color mixing layer 240 is greater than 100 μm. In other words, the thickness of the color mixing layer 240 is greater than the thickness of the epitaxial structure E plus the thickness of the sheet-like wavelength converting layer 180a. The color mixing layer 240 with a thicker thickness can be regarded as a light guiding layer, and can uniformly mix the light emitted by the epitaxial structure E and converted by the sheet-like wavelength converting layer 180a, so as to effectively enhance the light emitting uniformity of the light emitting device 100k.

Figure 12:
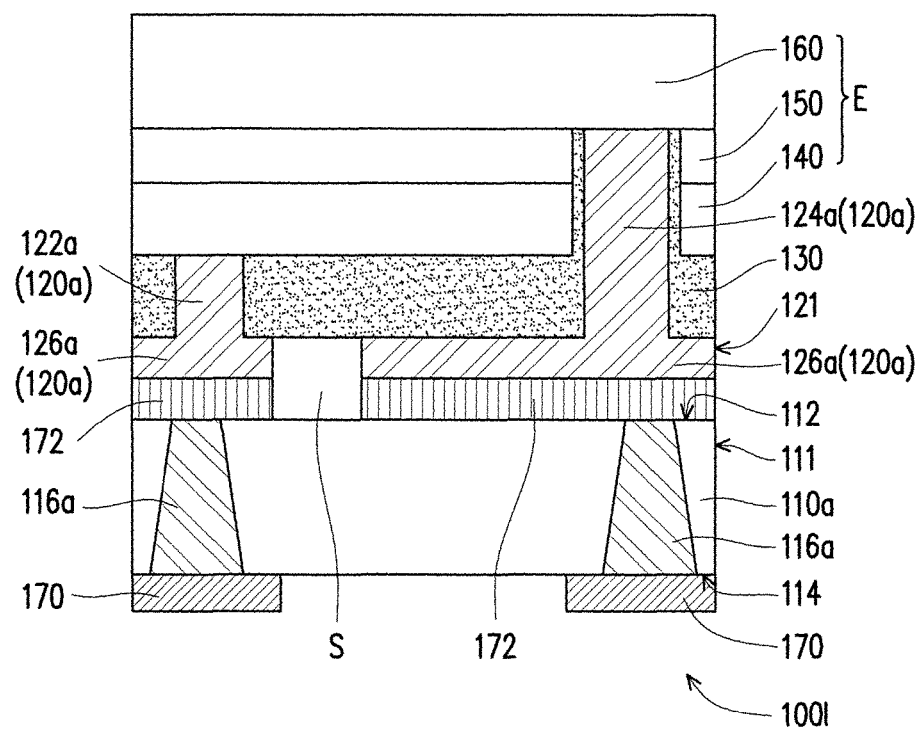
FIG. 12 is a schematic cross-sectional view of a light emitting device according to another embodiment of the invention.

FIG. 12 is a schematic cross-sectional view of a light emitting device according to another embodiment of the invention. Referring to FIG. 12 and FIG. 1A, the light emitting device 100l of the present embodiment is similar to the light emitting device 100a in FIG. 1A, and a main difference therebetween is that the light emitting device 100l of the present embodiment further includes a plurality of electrode pads 172 disposed on the upper surface 112 of the substrate 110a and connecting the conductive through hole 116a and the electrode connection layer 120a. In addition, the orthogonal projection of the buffer region S on the substrate 110a does not overlap the orthogonal projection of the electrode pad 172 of the substrate 110a. To be more specific, the electrode pads 172 and the connection layer 126a of the electrode connection layer 120a are disposed correspondingly, an orthogonal projection of the electrode pads 172 on the substrate 110a and an orthogonal projection of the connection layer 126a on the substrate 110a are completely overlapped and have a same projected area, and the buffer region S locates among the electrode pads 172, the substrate 110a and the connection layer 126a. Therefore, when the light emitting device 100l is in the fabrication process, the buffer region S can serve as a buffer between the electrode connection layer 120a and the electrode pads 172 under the operation in different temperatures, so as to increase the reliability of the light emitting device 100l. The material of the electrode pads 172 can be selected from chromium, tin, indium, platinum, gold, an alloy of materials selected from the above materials or a combination of the above materials, so as to have a good bonding effect between the electrode connection layer 120a and the electrode pads 172.

It should be noticed that in other embodiments that are not illustrated, the aforementioned elements such as the spaces 117g1, 117g2, 117g3 of the conductive through hole 116, the optical coupling layers 190c1, 190c3, 190d, the sheet-like wavelength converting layers 180a, 180e, 180f, the substrate 110g, the electrode connection layer 120h, the ohmic contact layer 210, the reflection layer 220, the insulation protection layer 230, the color mixing layer 240, and the electrode pads 172 can also be used, and those skilled in the art can determine the used elements based on the aforementioned description of the embodiments and according to an actual requirement, so as to achieve a required technical effect.

Figure 13:
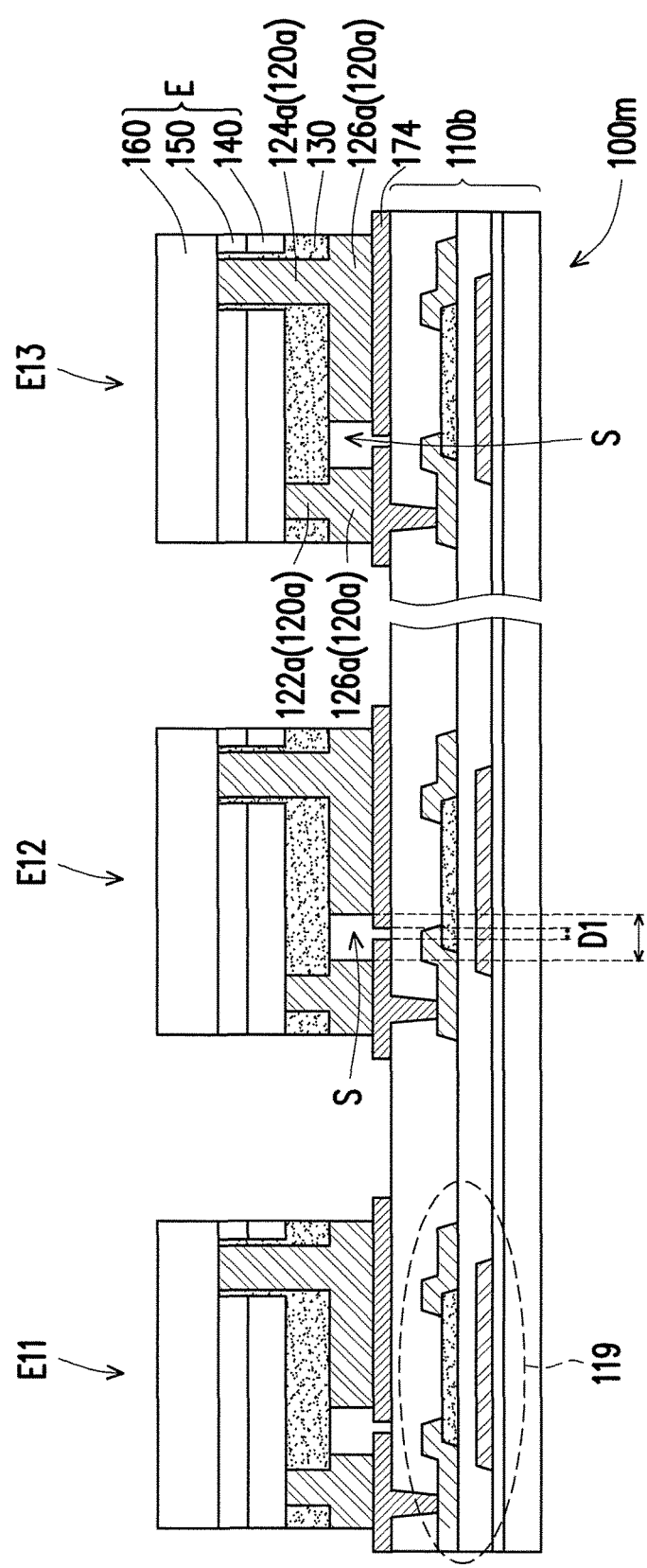
FIG. 13 is a schematic cross-sectional view of a light emitting device according to another embodiment of the invention.

FIG. 13 is a schematic cross-sectional view illustrating a light emitting device according to another embodiment of the invention. Referring to FIG. 13 and FIG. 1A, the light emitting device 100m of the present embodiment is similar to the light emitting device 100a in FIG. 1, and a main difference therebetween is that at least one epitaxial structure includes a plurality of epitaxial structures. The epitaxial structure include at least one red light epitaxial structure E11, at least one blue light epitaxial structure E12 and at least one green light epitaxial structure E13. The red light epitaxial structure E11, the blue light epitaxial structure E12 and the green light epitaxial structure E13 are disposed on the electrode connection layer 120a and separated from each other. Herein, the light emitting device 100m is embodied as a display device. The red light epitaxial structure E11, the blue light epitaxial structure E12 and the green light epitaxial structure E13 form the display pixels in the light emitting device 100m. A width of each of the epitaxial structures (e.g., the red light epitaxial structure E11 or the blue light epitaxial structure E12 or the green light epitaxial structure E13) is less than a width of the general epitaxial structure (e.g., the side length in a range from 0.2 millimeters to 1 millimeters). Herein, a width of each of the epitaxial structures of this embodiment is between 1 micrometer and 100 micrometers. In other words, each of the epitaxial structures of this embodiment is micron-scale epitaxial structure to have a smaller volume and better efficiency. More preferably, the width of each of the epitaxial structures of this embodiment is between 1 micrometer and 40 micrometers, which have a higher resolution. Moreover, a highest peak current density of an external quantum efficiency curve of each of the epitaxial structures of this embodiment is smaller than the peak current density of the epitaxial structure of the conventional light emitting diode. Preferably, the highest peak current density of the external quantum efficiency curve of each of the epitaxial structures of this embodiment is lower than 2 A/cm$^2$. More preferably, the highest peak current density of the external quantum efficiency curve of each of the epitaxial structures E of this embodiment is in a range from 0.5 A/cm$^2$ to 1.5 A/cm$^2$.

The substrate 110b includes a plurality of electrodes pads 174 separated from each other. The electrode connection layer 120a is disposed on and electrically connected to the electrode pads 174. The substrate 110b is a substrate with circuit electrodes for display. Herein, the substrate 110b is embodied as substrate a thin film transistor (TFT 119) substrate. However, the substrate 110b may also be a multilayer substrate such as a complementary metal oxide semiconductor substrate, a printed circuit board substrate or a flexible printed circuit board and the invention is not limited thereto. It should be noted that the electrode pads 174 have a distance D1 therebetween, and a width W1 of the buffer region S is 0.1 times to 4 times the distance D1 between the electrode pads 174. If the ratio is less than 0.1, the buffer space of the buffer region S is not enough, resulting in the connection layers 126a electrical connection and short-circuit. If the ratio is larger than 4 times, each of the epitaxial structures is difficult to connect correctly to the electrode pads 174 of the substrate 110b by the connection layer 126a. Preferably, a width W1 of the buffer region S is 0.5 to 1.5 times the distance D1 between the electrode pads 174, so that each of the epitaxial structures of this embodiment can have better process window when it is connected to the electrode pads 174 of the substrate 110b by the connection layer 126a.

The electrode connection layer 120a has a plurality of first electrodes 122a, a plurality of second electrodes 124a and a plurality of connection layers 126a disposed between the substrate 110b and the first electrodes 122a and disposed between the substrate 110b and the second electrodes 124a. The red light epitaxial structure E11, the blue light epitaxial structure E12 and the green light epitaxial structure E13 are disposed on the electrode connection layer 120a and electrically connected to the electrode connection layer 120a. Each of the epitaxial structures (e.g., the red light epitaxial structure E11 or the blue light epitaxial structure E12 or the green light epitaxial structure E13) corresponds to at least one first electrode 122a, at least one second electrode 124a, and one the connection layer 126a. Herein, a plurality connection layers 126a which are made of different material from the plurality of first electrodes 122a and the plurality of second electrodes 124a. More specifically, a melting point of the connection layer 126a is less than a melting point of the first electrode 122a or the second electrode 124a or a melting point of the second electrode 124a and a melting point of the first electrode 122a. Preferably, a melting point of the connection layer 126a is less than 250° C. More preferably, a inciting point of the connection layer 126a is less than 200° C. According to the different melting points of the materials, the epitaxial structure of this embodiment is connected to the electrode pads 174 of the substrate 110b through the connection layer 126a without heating to too high temperature, so as to can avoid damage to the epitaxial structure, and can obtain a better production yield. It should be noted that a Young's Modulus of the insulating layer 130 is less than a Young's Modulus of the electrode connection layer 120a, so as to provide the buffer required for the epitaxial structure of this embodiment to be connected to the electrode pads 174 of the substrate 110b by the connection layer 126a.

Figure 14:
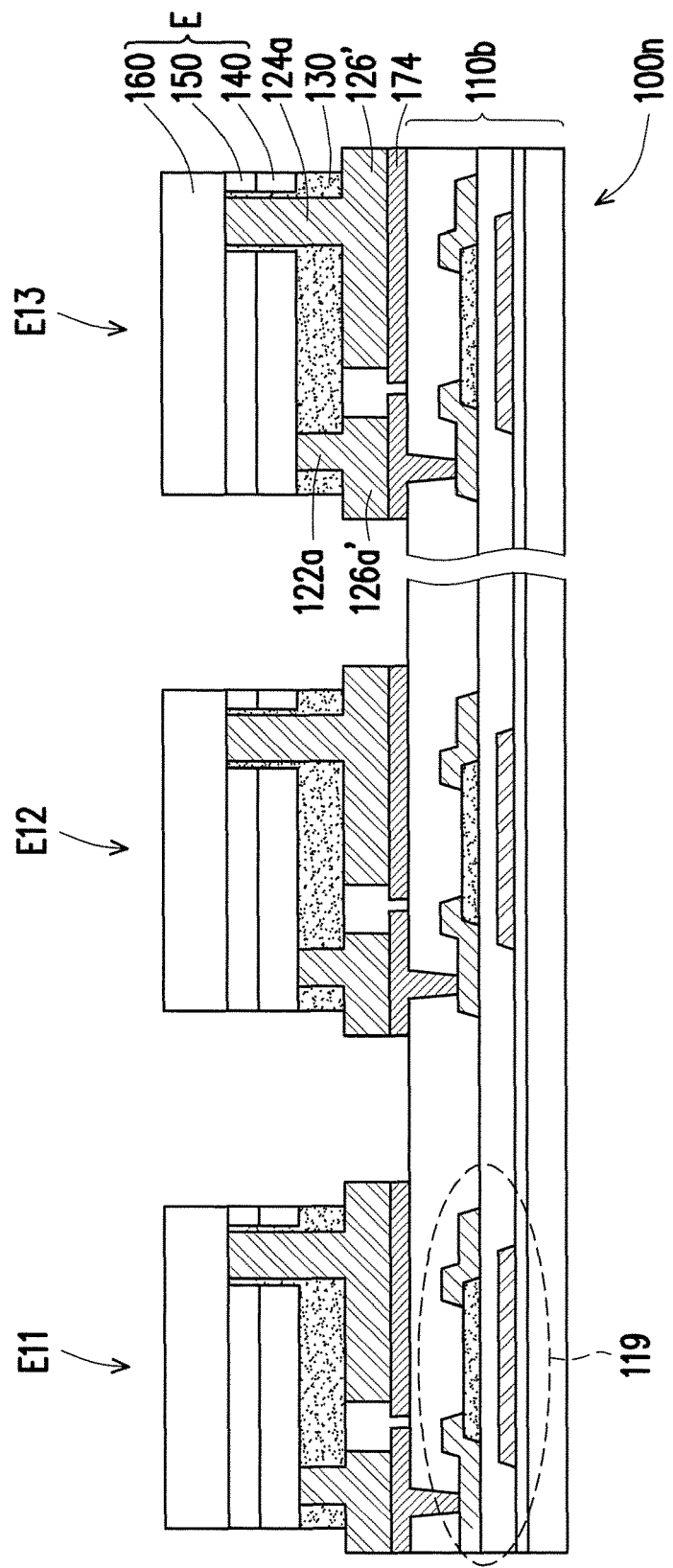
FIG. 14 is a schematic cross-sectional view of a light emitting device according to another embodiment of the invention.

FIG. 14 is a schematic cross-sectional view illustrating a light emitting device according to another embodiment of the invention. Referring to FIG. 14 and FIG. 13, the light emitting device 100n of the present embodiment is similar to the light emitting device 100m in FIG. 13, and a main difference therebetween is that the edges of the connection layer 126a' protrude from the side of each of the epitaxial structures (e.g., the red light epitaxial structure E11 or the blue light epitaxial structure E12 or the green light epitaxial structure E13). Because the connection layer 126a' has a larger area, each of the epitaxial structures of this embodiment can have a better yield when connecting to the electrode pads 174 of the substrate 110b through the connection layer 126a'.

Figure 15:
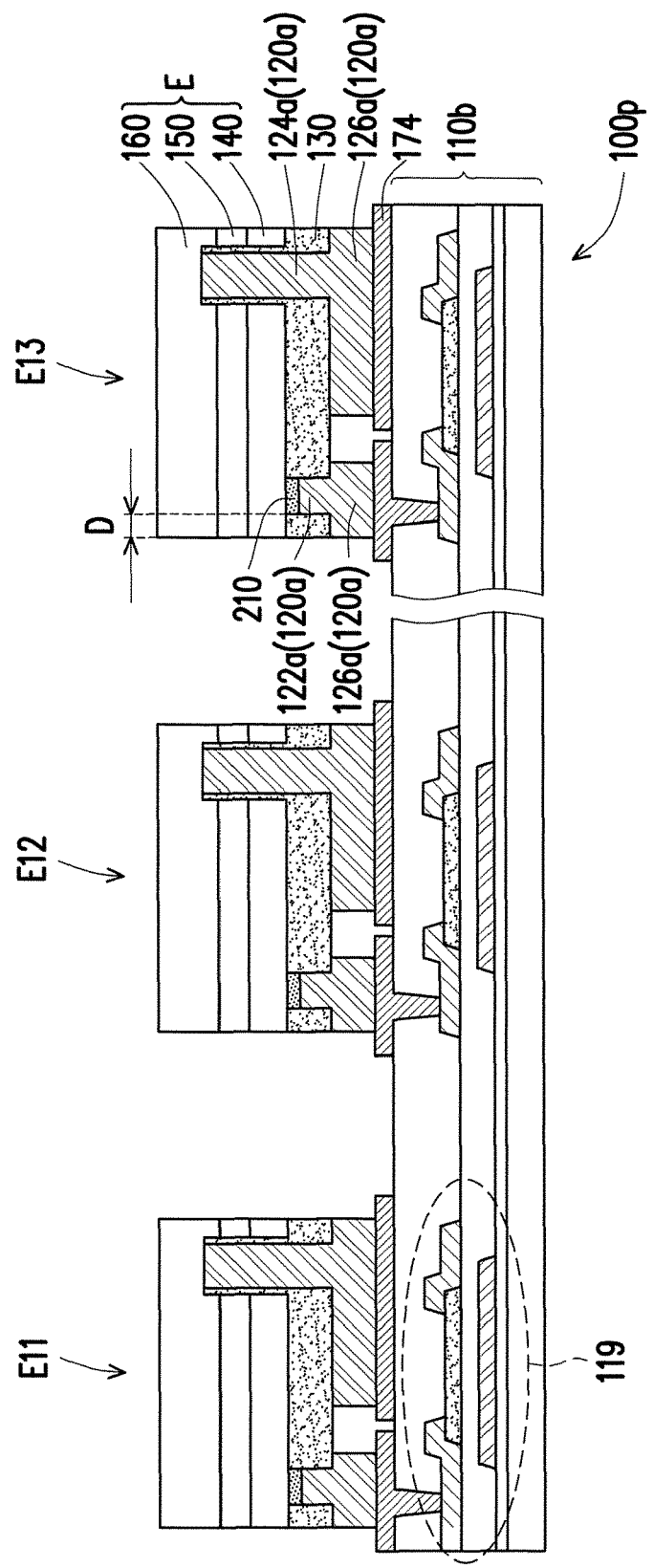
FIG. 15 is a schematic cross-sectional view of a light emitting device according to another embodiment of the invention.

FIG. 15 is a schematic cross-sectional view illustrating a light emitting device according to another embodiment of the invention. Referring to FIG. 15 and FIG. 13, the light emitting device 100p of the present embodiment is similar to the light emitting device 100m in FIG. 13, and a main difference therebetween is that the light emitting device 100p of the present embodiment further includes an ohmic contact layer 210, disposed between the first type semiconductor layer 140 and the insulating layer 130. Herein, configuration of the ohmic contact layer 210 can effectively enhance electrical contact between the first type semiconductor layer 140 and the first electrode 122a. It should be noted that a projection area of the ohmic contact layer 210 on the substrate 110b is less than a projection area of the first type semiconductor layer 140 on the substrate 110b. Since each of the epitaxial structures (e.g., the red light epitaxial structure E11 or the blue light epitaxial structure E12 or the green light epitaxial structure E13) is micron-scale, the area of the ohmic contact layer 210 is less than the first type semiconductor layer 140, so that the current can be concentrated to increase efficiency and avoid side leakage. Preferably, the edge of the ohmic contact layer 210 has a distance D from the edge of each of the epitaxial structures of this embodiment, wherein the distance D is greater than 0.1 microns and less than or equal to 5 microns.

Figure 16A:
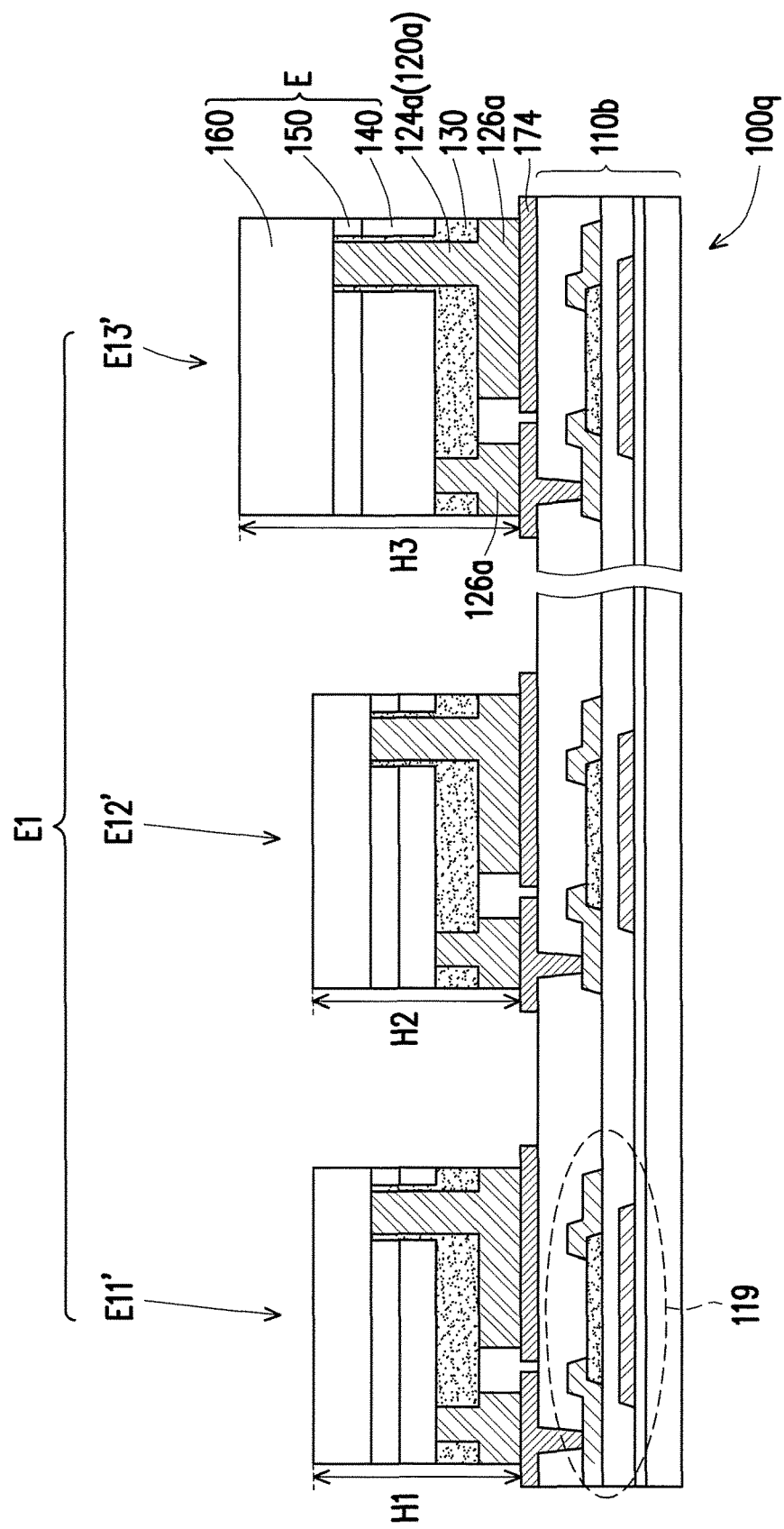
FIG. 16A is a schematic cross-sectional view of a light emitting device according to another embodiment of the invention.
Figure 16B:
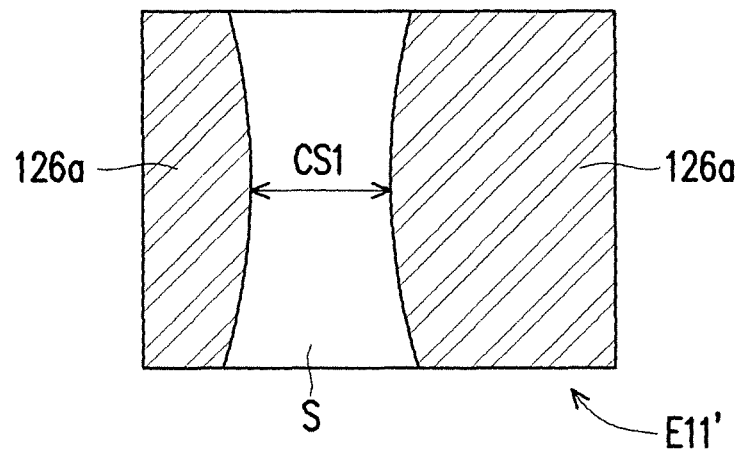
FIG. 16B is schematic top view illustrating the connection layer of the light emitting device in FIG. 16A
Figure 16B:
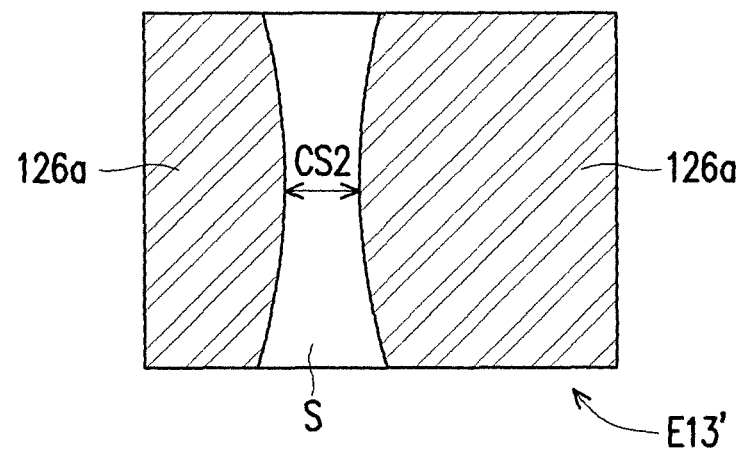

FIG. 16A is a schematic cross-sectional view illustrating a light emitting device according to another embodiment of the invention. FIG. 16B is schematic top view illustrating the connection layer of the light emitting device in FIG. 16A. Referring to FIG. 16A and FIG. 13 firstly, the light emitting device 100q of the present embodiment is similar to the light emitting device 100m in FIG. 13, and a main difference therebetween lies is that the at least one epitaxial structure E1 includes at least one first epitaxial structure (two first epitaxial structures E11', E12' are shown in FIG. 16A) and at least one second epitaxial structure (one second epitaxial structure E13' is shown in FIG. 16A), and the first epitaxial structures E11', E12' and the second epitaxial structure E13' have different light colors. Each of the first epitaxial structures E11' (or E12') has a first height H1 (or H2), the second epitaxial structure E13' has a second height H3', and the first height H1 (or H2) is less than the second height H3. Herein, the first epitaxial structures E11' and E12' have the same height. The epitaxial structures E11', E12' and the epitaxial structure E13' can be connected to the electrode pads 174 of the substrate 110b through the connection layer 126a at different time points without affecting the previously configured epitaxial structure.

In particular, as shown in FIG. 16B, the first epitaxial structure E11' corresponds to the buffer region S having a first central width CS1, and the second epitaxial structure E13' corresponds to the buffer region S having a second central width CS2, and the first central width CS1 is larger than the second central width CS2. In other words, the buffer region S of the second epitaxial structure E13' is smaller, resulting in a larger area of the connection layer 126a, so that when the higher height of the second epitaxial structure E13' is connected to the substrate 110b by the connection layer 126a, the force can be more uniform and has a stronger connection force.

In summary, since the electrode connection layer of the invention has the buffer region which can serve as a buffer between the electrode connection layer and other layers having different thermal expansion coefficient from the electrode connection layer under different temperature variation operation, so as to increase the reliability of the light emitting device of the invention.

Although the invention has been disclosed with reference to the aforesaid embodiments, they are not intended to limit the invention. It will be apparent to one of ordinary skill in the art that modifications and variations to the described embodiments may be made without departing from the spirit and the scope of the invention. Accordingly, the scope of the invention will be defined by the attached claims and not by the above detailed descriptions.

What is claimed is:

1. A light emitting device, comprising:
    a substrate, having an upper surface and a plurality of electrode pads disposed on the upper surface;
    an electrode connection layer, disposed on the upper surface of the substrate and electrically connected to the plurality of electrode pads, wherein the electrode connection layer has at least one first electrode, at least one second electrode and at least one connection layer disposed between the substrate and the at least one first electrode and disposed between the substrate and the at least one second electrode, the at least one connection layer has at least one buffer region exposed on the upper surface of the substrate, and the at least one buffer region is an empty gap; and
    at least one epitaxial structure, disposed on the electrode connection layer and electrically connected to the electrode connection layer.

2. The light emitting device as recited in claim 1, wherein a center width of the at least one buffer region is smaller than an edge width of the at least one buffer region.

3. The light emitting device as recited in claim 1, wherein the plurality of electrode pads have a distance therebetween, and a width of the at least one buffer region is 0.1 to 4 times the distance between the plurality of electrode pads.

4. The light emitting device as recited in claim 1, further comprising:

an insulating layer, disposed on the electrode connection layer and insulating from the at least one first electrode and the at least one second electrode, wherein the at least one buffer region locates among the insulating layer, the at least one connection layer, and the substrate.

5. The light emitting device as recited in claim 4, wherein a Young's Modulus of the insulating layer is less than a Young's Modulus of the electrode connection layer.

6. The light emitting device as recited in claim 4, wherein the at least one epitaxial structure further comprises:
    a first type semiconductor layer, disposed on the insulating layer, wherein the at least one first electrode penetrates through the insulating layer and be electrically connected to the first type semiconductor layer;
    a light emitting layer, disposed on the first type semiconductor layer; and
    a second type semiconductor layer, disposed on the light emitting layer, wherein the at least one second electrode penetrates through the insulating layer, the first type semiconductor layer and the light emitting layer so as to electrically connect to the second type semiconductor layer.

7. The light emitting device as recited in claim 6, further comprising:
    an ohmic contact layer, disposed between the first type semiconductor layer and the insulating layer.

8. The light emitting device as recited in claim 7, wherein a projection area of the ohmic contact layer on the substrate is less than a projection area of the first type semiconductor layer.

9. The light emitting device as recited in claim 7, further comprising:
    an insulation protection layer, covering an edge of the first type semiconductor layer, an edge of the light emitting layer, and an edge of the second type semiconductor layer, wherein an edge of the insulation protection layer is aligned with the edge of the insulating layer.

10. The light emitting device as recited in claim 1, further comprising:
    a wavelength converting layer, disposed on the at least one epitaxial structure, wherein an edge of the wavelength converting layer is aligned with an edge of the substrate.

11. The light emitting device as recited in claim 10, wherein the at least one epitaxial structure has a rough surface, and the rough surface and the wavelength converting layer have nano-scale voids therebetween.

12. The light emitting device as recited in claim 1, wherein at least one epitaxial structure is a plurality of epitaxial structures, and each of the plurality of epitaxial structures corresponds to at least one of the at least one first electrode, at least one of the at least one second electrode and one of the at least one connection layer.

13. The light emitting device as recited in claim 12, wherein the plurality of epitaxial structures comprise at least one red light epitaxial structure, at least one blue light epitaxial structure and at least one green light epitaxial structure.

14. The light emitting device as recited in claim 12, wherein the plurality of epitaxial structures comprise at least one first epitaxial structure and at least one second epitaxial structure, and the at least one first epitaxial structure and the at least one second epitaxial structure have different light colors, and the at least one first epitaxial structure has a first height, the at least one second epitaxial structure has a second height, and the first height is less than the second height.

15. The light emitting device as recited in claim 14, wherein the at least one first epitaxial structure corresponds to the at least one buffer region having a first central width, the at least one second epitaxial structure corresponds to the at least one buffer region having a second central width, and the first central width is larger than the second central width.

16. The light emitting device as recited in claim 1, wherein a width of the at least one epitaxial structures is between 1 micrometer and 100 micrometers.

17. The light emitting device as recited in claim 1, wherein the substrate is a multi-layer substrate.

\* \* \* \* \*